US012015432B2

(12) United States Patent
Iyengar et al.

(10) Patent No.: US 12,015,432 B2
(45) Date of Patent: Jun. 18, 2024

(54) ADAPTIVE GAIN FOR RECEIVING WIRELESS SIGNALS

(71) Applicant: QUALCOMM Incorporated, San Diego, CA (US)

(72) Inventors: Pranav Iyengar, San Diego, CA (US); Liang Zhao, Saratoga, CA (US); Daniel Carolin, San Diego, CA (US); Rayman Wai Pon, Cupertino, CA (US); Angelica Wong, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/479,962

(22) Filed: Sep. 20, 2021

(65) Prior Publication Data

US 2023/0091514 A1 Mar. 23, 2023

(51) Int. Cl.
*H04B 1/04* (2006.01)
*H04B 1/00* (2006.01)

(52) U.S. Cl.
CPC .............. *H04B 1/04* (2013.01); *H04B 1/0035* (2013.01); *H04B 1/0042* (2013.01); *H04B 2001/0416* (2013.01)

(58) Field of Classification Search
CPC ... H04B 1/30; H04B 1/16; H04B 1/10; H04B 1/109; H04B 1/0021; H04B 1/0475; H04B 1/28; H04B 1/0017; H04B 7/0413; H04B 1/0007; H04B 1/0483; H04B 1/26; H04B 1/40; H04B 2001/0416; H04B 7/0802; H04B 1/0003; H04B 1/001; H04B 1/0014; H04B 1/1018; H04B 1/1036; H04B 1/18; H04B 1/38; H04B 1/406; H04B 7/04;

(Continued)

(56) References Cited

U.S. PATENT DOCUMENTS 7,212,798 B1 * 5/2007 Adams ................. H03G 3/3068
375/345
10,819,302 B1 * 10/2020 Srinivasan ............ H04B 1/109

(Continued)

FOREIGN PATENT DOCUMENTS

EP  1175004 A1  1/2002
EP  1145427 B1  4/2004

OTHER PUBLICATIONS

International Search Report and Written Opinion—PCT/US2022/041351—ISA/EPO—Dec. 9, 2022.

*Primary Examiner* — Golam Sorowar
(74) *Attorney, Agent, or Firm* — SUNSTEIN LLP/Qualcomm

(57) ABSTRACT

A radio-frequency signal preconditioning method includes: receiving, at a radio-frequency signal preconditioning apparatus from an antenna, a radio-frequency signal; selectively providing, at the radio-frequency signal preconditioning apparatus, any of a plurality of gains to the radio-frequency signal to produce an output signal, the plurality of gains spanning a first range; and providing, from the radio-frequency signal preconditioning apparatus, the output signal to a conversion circuit configured to convert the output signal from an analog signal at a radio frequency to a digital signal at a baseband frequency, the conversion circuit having a dynamic range spanning a second range that is smaller than the first range.

26 Claims, 11 Drawing Sheets

(58) Field of Classification Search
CPC ...... H04B 7/0404; H04B 7/06; H04B 7/0691;
H04B 7/0848; H04B 7/0871; H04B
7/0874; H03G 3/3068; H03G 3/3052;
H03G 3/20; H03G 3/3036; H03G
2201/307; H03G 1/04; H03G 2201/302;
H03G 3/3042; H03G 3/3073; H03G
3/3078; H03G 1/0023; H03G 11/08;
H03G 2201/103; H03G 2201/206; H03G
3/3063; H03D 3/007; H03D 7/165; H03D
2200/0025; H03D 1/2245; H03D 3/009;
H03D 7/1441; H03D 7/1458; H03D
2200/0084; H03D 7/1466; H03D 3/00;
H03D 3/008; H03D 7/1433; H03D
7/1483; H04L 25/08; H04L 27/2647;
H04L 1/06; H04L 27/3845; H04L 1/22;
H04L 25/06; H04L 27/00; H04L 27/0014;
H04L 27/06; H04L 27/2653; H04L
27/2657; H04L 27/38; H04L 2027/0016;
H04L 2027/0024; H04L 25/061; H04L
1/0003; H04L 1/0009; H04L 1/0036;
H04L 25/03; H04L 25/067; H04W 4/18;
H04W 84/12; H04W 88/06; H04W 88/02;
H04W 84/042; H04W 88/08; H04W
24/00

See application file for complete search history.

(56) References Cited

U.S. PATENT DOCUMENTS

| | | | |
|---|---|---|---|
| 2002/0068540 | A1 | 6/2002 | Skarman et al. |
| 2004/0242177 | A1* | 12/2004 | Yang ...................... H04W 52/52 455/234.1 |
| 2007/0135071 | A1* | 6/2007 | Lee ........................ H04W 52/52 455/232.1 |
| 2011/0171922 | A1* | 7/2011 | Kim ........................ H04B 1/525 455/307 |
| 2012/0147928 | A1* | 6/2012 | Nakano ............... H04L 27/2601 375/E1.001 |
| 2013/0251078 | A1 | 9/2013 | Bachl et al. |
| 2014/0133606 | A1* | 5/2014 | Mochizuki ........ H04W 52/0245 375/340 |
| 2017/0034796 | A1* | 2/2017 | Yun ............................ H04B 1/16 |
| 2018/0062602 | A1* | 3/2018 | Kajakine .............. H03G 3/3078 |
| 2021/0289410 | A1 | 9/2021 | Dai et al. |

* cited by examiner

ADAPTIVE GAIN FOR RECEIVING WIRELESS SIGNALS

BACKGROUND

Wireless communication systems have developed through various generations, including a first-generation analog wireless phone service (1G), a second-generation (2G) digital wireless phone service (including interim 2.5G and 2.75G networks), a third-generation (3G) high speed data, Internet-capable wireless service, a fourth-generation (4G) service (e.g., Long Term Evolution (LTE) or WiMax), a fifth-generation (5G) service, etc. There are presently many different types of wireless communication systems in use, including Cellular and Personal Communications Service (PCS) systems. Examples of known cellular systems include the cellular Analog Advanced Mobile Phone System (AMPS), and digital cellular systems based on Code Division Multiple Access (CDMA), Frequency Division Multiple Access (FDMA), Orthogonal Frequency Division Multiple Access (OFDMA), Time Division Multiple Access (TDMA), the Global System for Mobile access (GSM) variation of TDMA, etc.

A fifth generation (5G) mobile standard calls for higher data transfer speeds, greater numbers of connections, and better coverage, among other improvements. The 5G standard, according to the Next Generation Mobile Networks Alliance, is designed to provide data rates of several tens of megabits per second to each of tens of thousands of users, with 1 gigabit per second to tens of workers on an office floor. Several hundreds of thousands of simultaneous connections should be supported in order to support large sensor deployments. Consequently, the spectral efficiency of 5G mobile communications should be significantly enhanced compared to the current 4G standard. Furthermore, signaling efficiencies should be enhanced and latency should be substantially reduced compared to current standards.

Various signals may be received by devices for various purposes such as communication and/or positioning. For example, positions of devices, such as mobile devices, may be determined using terrestrial-based positioning signals and/or satellite positioning signals. Satellite positioning system receivers may be included in various devices for receiving and measuring satellite positioning signals. Measurements of the satellite positioning signals may be processed to determine position information, such as ranges between satellites and the receiver and/or a position estimate for the receiver.

SUMMARY

In an embodiment, a radio-frequency signal preconditioning apparatus includes: a variable gain circuit configured to receive a radio-frequency signal from an antenna and configured to selectively provide any of a plurality of gains to the radio-frequency signal to produce an output signal, the plurality of gains spanning a first range; and an output communicatively coupled to the variable gain circuit and configured to receive the output signal and to provide the output signal to a conversion circuit configured to convert the output signal from an analog signal at a radio frequency to a digital signal at a baseband frequency, the conversion circuit having a dynamic range spanning a second range that is smaller than the first range.

In an embodiment, a radio-frequency signal preconditioning method includes: receiving, at a radio-frequency signal preconditioning apparatus from an antenna, a radio-frequency signal; selectively providing, at the radio-frequency signal preconditioning apparatus, any of a plurality of gains to the radio-frequency signal to produce an output signal, the plurality of gains spanning a first range; and providing, from the radio-frequency signal preconditioning apparatus, the output signal to a conversion circuit configured to convert the output signal from an analog signal at a radio frequency to a digital signal at a baseband frequency, the conversion circuit having a dynamic range spanning a second range that is smaller than the first range.

In an embodiment, a radio-frequency signal preconditioning apparatus includes: means for receiving a radio-frequency signal from an antenna; means for selectively providing any of a plurality of gains to the radio-frequency signal to produce an output signal, the plurality of gains spanning a first range; and means for providing the output signal to a conversion circuit configured to convert the output signal from an analog signal at a radio frequency to a digital signal at a baseband frequency, the conversion circuit having a dynamic range spanning a second range that is smaller than the first range.

In an embodiment, a non-transitory, processor-readable storage medium includes processor-readable instructions to cause a processor of a radio-frequency signal preconditioning apparatus to: receive a radio-frequency signal from an antenna; and selectively cause the radio-frequency signal preconditioning apparatus to provide any of a plurality of gains to the radio-frequency signal to produce an output signal, the plurality of gains spanning a first range and to provide the output signal to a conversion circuit configured to convert the output signal from an analog signal at a radio frequency to a digital signal at a baseband frequency, the conversion circuit having a dynamic range spanning a second range that is smaller than the first range.

DETAILED DESCRIPTION

Figure 1:
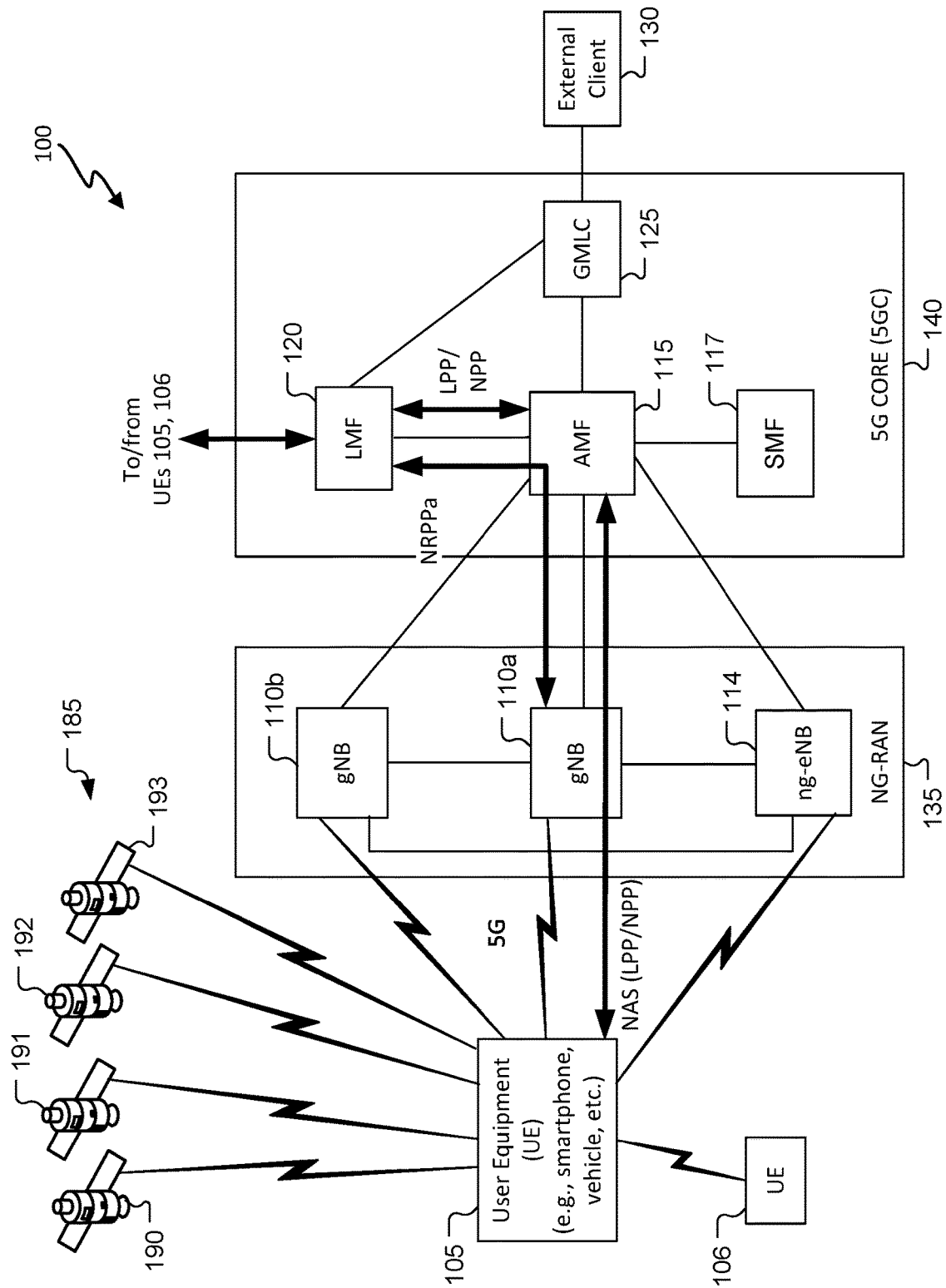
FIG. 1 is a simplified diagram of an example wireless communications system.

Techniques are discussed herein for providing an appropriate gain to a signal such that a downstream device will operate as desired. For example, a wireless signal can be received, transduced to a wired signal, and provided to a signal preconditioner. The signal preconditioner can provide a variety of positive and/or negative gains to the wired signal. The signal preconditioner can be statically set, e.g., during manufacture or during initial use, to provide one of multiple possible gains. The signal preconditioner may be set to provide that gain permanently. Alternatively, a signal preconditioner may dynamically adjust over time the gain provided to a received signal. The signal preconditioner may be configured to adjust the gain provided to different signals, e.g., corresponding to different frequency bands. The signal preconditioner may be configured to apply the same gain permanently to some signals and to adjust over time the gain provided to other signals (e.g., of a different frequency band than the signals to which the same gain is permanently applied). The signal preconditioner can provide more gain to a received signal than a conversion circuit that is disposed downstream of the signal preconditioner. The signal preconditioner may adjust a gain provided to a signal that is outside of a dynamic range of the conversion circuit to produce a gain-adjusted signal that is within the dynamic range of the conversion circuit (e.g., an RFIC (radio frequency integrated circuit)). These are examples, and other examples (of UEs and/or criteria) may be implemented.

Items and/or techniques described herein may provide one or more of the following capabilities, as well as other capabilities not mentioned. An RFIC may be operated within a dynamic range of the RFIC by dynamically applying different gains to signals that are outside of the dynamic range of the RFIC. An RFIC may be operated within a dynamic range of the RFIC for signals that include interference (e.g., jamming). Other capabilities may be provided and not every implementation according to the disclosure must provide any, let alone all, of the capabilities discussed.

Obtaining the locations of mobile devices that are accessing a wireless network may be useful for many applications including, for example, emergency calls, personal navigation, consumer asset tracking, locating a friend or family member, etc. Existing positioning methods include methods based on measuring radio signals transmitted from a variety of devices or entities including satellite vehicles (SVs) and terrestrial radio sources in a wireless network such as base stations and access points.

The description may refer to sequences of actions to be performed, for example, by elements of a computing device. Various actions described herein can be performed by specific circuits (e.g., an application specific integrated circuit (ASIC)), by program instructions being executed by one or more processors, or by a combination of both. Sequences of actions described herein may be embodied within a non-transitory computer-readable medium having stored thereon a corresponding set of computer instructions that upon execution would cause an associated processor to perform the functionality described herein. Thus, the various examples described herein may be embodied in a number of different forms, all of which are within the scope of the disclosure, including claimed subject matter.

As used herein, the terms "user equipment" (UE) and "base station" are not specific to or otherwise limited to any particular Radio Access Technology (RAT), unless otherwise noted. In general, such UEs may be any wireless communication device (e.g., a mobile phone, router, tablet computer, laptop computer, consumer asset tracking device, Internet of Things (IoT) device, etc.) used by a user to communicate over a wireless communications network. A UE may be mobile or may (e.g., at certain times) be stationary, and may communicate with a Radio Access Network (RAN). As used herein, the term "UE" may be referred to interchangeably as an "access terminal" or "AT," a "client device," a "wireless device," a "subscriber device," a "subscriber terminal," a "subscriber station," a "user terminal" or UT, a "mobile terminal," a "mobile station," a "mobile device," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, WiFi networks (e.g., based on IEEE 802.11, etc.) and so on.

A base station may operate according to one of several RATs in communication with UEs depending on the network in which it is deployed. Examples of a base station include an Access Point (AP), a Network Node, a NodeB, an evolved NodeB (eNB), or a general Node B (gNodeB, gNB). In addition, in some systems a base station may provide purely edge node signaling functions while in other systems it may provide additional control and/or network management functions.

UEs may be embodied by any of a number of types of devices including but not limited to printed circuit (PC) cards, compact flash devices, external or internal modems, wireless or wireline phones, smartphones, tablets, consumer asset tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

As used herein, the term "cell" or "sector" may correspond to one of a plurality of cells of a base station, or to the base station itself, depending on the context. The term "cell" may refer to a logical communication entity used for communication with a base station (for example, over a carrier), and may be associated with an identifier for distinguishing neighboring cells (for example, a physical cell identifier (PCID), a virtual cell identifier (VCID)) operating via the same or a different carrier. In some examples, a carrier may support multiple cells, and different cells may be configured according to different protocol types (for example, machine-type communication (MTC), narrowband Internet-of-Things (NB-IoT), enhanced mobile broadband (eMBB), or others) that may provide access for different types of devices. In some examples, the term "cell" may refer to a portion of a geographic coverage area (for example, a sector) over which the logical entity operates.

Referring to FIG. 1, an example of a communication system 100 includes a UE 105, a UE 106, a Radio Access Network (RAN) 135, here a Fifth Generation (5G) Next Generation (NG) RAN (NG-RAN), and a 5G Core Network (5GC) 140. The UE 105 and/or the UE 106 may be, e.g., an IoT device, a location tracker device, a cellular telephone, a vehicle (e.g., a car, a truck, a bus, a boat, etc.), or other device. A 5G network may also be referred to as a New Radio (NR) network; NG-RAN 135 may be referred to as a 5G RAN or as an NR RAN; and 5GC 140 may be referred to as an NG Core network (NGC). Standardization of an NG-RAN and 5GC is ongoing in the 3rd Generation Partnership Project (3GPP). Accordingly, the NG-RAN 135 and the 5GC 140 may conform to current or future standards for 5G support from 3GPP. The NG-RAN 135 may be another type of RAN, e.g., a 3G RAN, a 4G Long Term Evolution (LTE) RAN, etc. The UE 106 may be configured and coupled similarly to the UE 105 to send and/or receive signals to/from similar other entities in the system 100, but such signaling is not indicated in FIG. 1 for the sake of simplicity of the figure. Similarly, the discussion focuses on the UE 105 for the sake of simplicity. The communication system 100 may utilize information from a constellation 185 of satellite vehicles (SVs) 190, 191, 192, 193 for a Satellite Positioning System (SPS) (e.g., a Global Navigation Satellite System (GNSS)) like the Global Positioning System (GPS), the Global Navigation Satellite System (GLONASS), Galileo, or Beidou or some other local or regional SPS such as the Indian Regional Navigational Satellite System (IRNSS), the European Geostationary Navigation Overlay Service (EGNOS), the Quasi-Zenith Satellite System (QZSS, also called Michibiki), or the Wide Area Augmentation System (WAAS). Additional components of the communication system 100 are described below. The communication system 100 may include additional or alternative components.

As shown in FIG. 1, the NG-RAN 135 includes NR nodeBs (gNBs) 110a, 110b, and a next generation eNodeB (ng-eNB) 114, and the 5GC 140 includes an Access and Mobility Management Function (AMF) 115, a Session Management Function (SMF) 117, a Location Management Function (LMF) 120, and a Gateway Mobile Location Center (GMLC) 125. The gNBs 110a, 110b and the ng-eNB 114 are communicatively coupled to each other, are each configured to bi-directionally wirelessly communicate with the UE 105, and are each communicatively coupled to, and configured to bi-directionally communicate with, the AMF 115. The gNBs 110a, 110b, and the ng-eNB 114 may be referred to as base stations (BSs). The AMF 115, the SMF 117, the LMF 120, and the GMLC 125 are communicatively coupled to each other, and the GMLC is communicatively coupled to an external client 130. The SMF 117 may serve as an initial contact point of a Service Control Function (SCF) (not shown) to create, control, and delete media sessions. Base stations such as the gNBs 110a, 110b and/or the ng-eNB 114 may be a macro cell (e.g., a high-power cellular base station), or a small cell (e.g., a low-power cellular base station), or an access point (e.g., a short-range base station configured to communicate with short-range technology such as WiFi, WiFi-Direct (WiFi-D), Bluetooth®, Bluetooth®-low energy (BLE), Zigbee, etc. One or more BSs, e.g., one or more of the gNBs 110a, 110b and/or the ng-eNB 114 may be configured to communicate with the UE 105 via multiple carriers. Each of the gNBs 110a, 110b and the ng-eNB 114 may provide communication coverage for a respective geographic region, e.g. a cell. Each cell may be partitioned into multiple sectors as a function of the base station antennas.

FIG. 1 provides a generalized illustration of various components, any or all of which may be utilized as appropriate, and each of which may be duplicated or omitted as necessary. Specifically, although one UE 105 is illustrated, many UEs (e.g., hundreds, thousands, millions, etc.) may be utilized in the communication system 100. Similarly, the communication system 100 may include a larger (or smaller) number of SVs (i.e., more or fewer than the four SVs 190-193 shown), gNBs 110a, 110b, ng-eNBs 114, AMFs 115, external clients 130, and/or other components. The illustrated connections that connect the various components in the communication system 100 include data and signaling connections which may include additional (intermediary) components, direct or indirect physical and/or wireless connections, and/or additional networks. Furthermore, components may be rearranged, combined, separated, substituted, and/or omitted, depending on desired functionality.

While FIG. 1 illustrates a 5G-based network, similar network implementations and configurations may be used for other communication technologies, such as 3G, Long Term Evolution (LTE), etc. Implementations described herein (be they for 5G technology and/or for one or more other communication technologies and/or protocols) may be used to transmit (or broadcast) directional synchronization signals, receive and measure directional signals at UEs (e.g., the UE 105) and/or provide location assistance to the UE 105 (via the GMLC 125 or other location server) and/or compute a location for the UE 105 at a location-capable device such as the UE 105, the gNB 110a, 110b, or the LMF 120 based on measurement quantities received at the UE 105 for such directionally-transmitted signals. The gateway mobile location center (GMLC) 125, the location management function (LMF) 120, the access and mobility management function (AMF) 115, the SMF 117, the ng-eNB (eNodeB) 114 and the gNBs (gNodeBs) 110a, 110b are examples and may, in various embodiments, be replaced by or include various other location server functionality and/or base station functionality respectively.

The system 100 is capable of wireless communication in that components of the system 100 can communicate with one another (at least some times using wireless connections) directly or indirectly, e.g., via the gNBs 110a, 110b, the ng-eNB 114, and/or the 5GC 140 (and/or one or more other devices not shown, such as one or more other base transceiver stations). For indirect communications, the communications may be altered during transmission from one entity to another, e.g., to alter header information of data packets, to change format, etc. The UE 105 may include multiple UEs and may be a mobile wireless communication device, but may communicate wirelessly and via wired connections. The UE 105 may be any of a variety of devices, e.g., a smartphone, a tablet computer, a vehicle-based device, etc., but these are examples as the UE 105 is not required to be any of these configurations, and other configurations of UEs may be used. Other UEs may include wearable devices (e.g., smart watches, smart jewelry, smart glasses or headsets, etc.). Still other UEs may be used, whether currently existing or developed in the future. Further, other wireless devices (whether mobile or not) may be implemented within the system 100 and may communicate with each other and/or with the UE 105, the gNBs 110a, 110b, the ng-eNB 114, the 5GC 140, and/or the external client 130. For example, such other devices may include internet of thing (IoT) devices, medical devices, home entertainment and/or automation devices, etc. The 5GC 140 may communicate with the external client 130 (e.g., a computer system), e.g., to allow the external client 130 to request and/or receive location information regarding the UE 105 (e.g., via the GMLC 125).

The UE 105 or other devices may be configured to communicate in various networks and/or for various purposes and/or using various technologies (e.g., 5G, Wi-Fi communication, multiple frequencies of Wi-Fi communication, satellite positioning, one or more types of communications (e.g., GSM (Global System for Mobiles), CDMA (Code Division Multiple Access), LTE (Long-Term Evolution), V2X (Vehicle-to-Everything, e.g., V2P (Vehicle-to-Pedestrian), V2I (Vehicle-to-Infrastructure), V2V (Vehicle-to-Vehicle), etc.), IEEE 802.11p, etc.). V2X communications may be cellular (Cellular-V2X (C-V2X)) and/or WiFi (e.g., DSRC (Dedicated Short-Range Connection)). The system 100 may support operation on multiple carriers (waveform signals of different frequencies). Multi-carrier transmitters can transmit modulated signals simultaneously on the multiple carriers. Each modulated signal may be a Code Division Multiple Access (CDMA) signal, a Time Division Multiple Access (TDMA) signal, an Orthogonal Frequency Division Multiple Access (OFDMA) signal, a Single-Carrier Frequency Division Multiple Access (SC-FDMA) signal, etc. Each modulated signal may be sent on a different carrier and may carry pilot, overhead information, data, etc. The UEs 105, 106 may communicate with each other through UE-to-UE sidelink (SL) communications by transmitting over one or more sidelink channels such as a physical sidelink synchronization channel (PSSCH), a physical sidelink broadcast channel (PSBCH), or a physical sidelink control channel (PSCCH).

The UE 105 may comprise and/or may be referred to as a device, a mobile device, a wireless device, a mobile terminal, a terminal, a mobile station (MS), a Secure User Plane Location (SUPL) Enabled Terminal (SET), or by some other name. Moreover, the UE 105 may correspond to a cellphone, smartphone, laptop, tablet, PDA, consumer asset tracking device, navigation device, Internet of Things (IoT) device, health monitors, security systems, smart city sensors, smart meters, wearable trackers, or some other portable or moveable device. Typically, though not necessarily, the UE 105 may support wireless communication using one or more Radio Access Technologies (RATs) such as Global System for Mobile communication (GSM), Code Division Multiple Access (CDMA), Wideband CDMA (WCDMA), LTE, High Rate Packet Data (HRPD), IEEE 802.11 WiFi (also referred to as Wi-Fi), Bluetooth® (BT), Worldwide Interoperability for Microwave Access (WiMAX), 5G new radio (NR) (e.g., using the NG-RAN 135 and the 5GC 140), etc. The UE 105 may support wireless communication using a Wireless Local Area Network (WLAN) which may connect to other networks (e.g., the Internet) using a Digital Subscriber Line (DSL) or packet cable, for example. The use of one or more of these RATs may allow the UE 105 to communicate with the external client 130 (e.g., via elements of the 5GC 140 not shown in FIG. 1, or possibly via the GMLC 125) and/or allow the external client 130 to receive location information regarding the UE 105 (e.g., via the GMLC 125).

The UE 105 may include a single entity or may include multiple entities such as in a personal area network where a user may employ audio, video and/or data I/O (input/output) devices and/or body sensors and a separate wireline or wireless modem. An estimate of a location of the UE 105 may be referred to as a location, location estimate, location fix, fix, position, position estimate, or position fix, and may be geographic, thus providing location coordinates for the UE 105 (e.g., latitude and longitude) which may or may not include an altitude component (e.g., height above sea level, height above or depth below ground level, floor level, or basement level). Alternatively, a location of the UE 105 may be expressed as a civic location (e.g., as a postal address or the designation of some point or small area in a building such as a particular room or floor). A location of the UE 105 may be expressed as an area or volume (defined either geographically or in civic form) within which the UE 105 is expected to be located with some probability or confidence level (e.g., 67%, 95%, etc.). A location of the UE 105 may be expressed as a relative location comprising, for example, a distance and direction from a known location. The relative location may be expressed as relative coordinates (e.g., X, Y (and Z) coordinates) defined relative to some origin at a known location which may be defined, e.g., geographically, in civic terms, or by reference to a point, area, or volume, e.g., indicated on a map, floor plan, or building plan. In the description contained herein, the use of the term location may comprise any of these variants unless indicated otherwise. When computing the location of a UE, it is common to solve for local x, y, and possibly z coordinates and then, if desired, convert the local coordinates into absolute coordinates (e.g., for latitude, longitude, and altitude above or below mean sea level).

The GMLC 125 may support a location request for the UE 105 received from the external client 130 and may forward such a location request to the AMF 115 for forwarding by the AMF 115 to the LMF 120 or may forward the location request directly to the LMF 120. A location response from the LMF 120 (e.g., containing a location estimate for the UE 105) may be returned to the GMLC 125 either directly or via the AMF 115 and the GMLC 125 may then return the location response (e.g., containing the location estimate) to the external client 130. The GMLC 125 is shown connected to both the AMF 115 and LMF 120, though may not be connected to the AMF 115 or the LMF 120 in some implementations.

Figure 2:
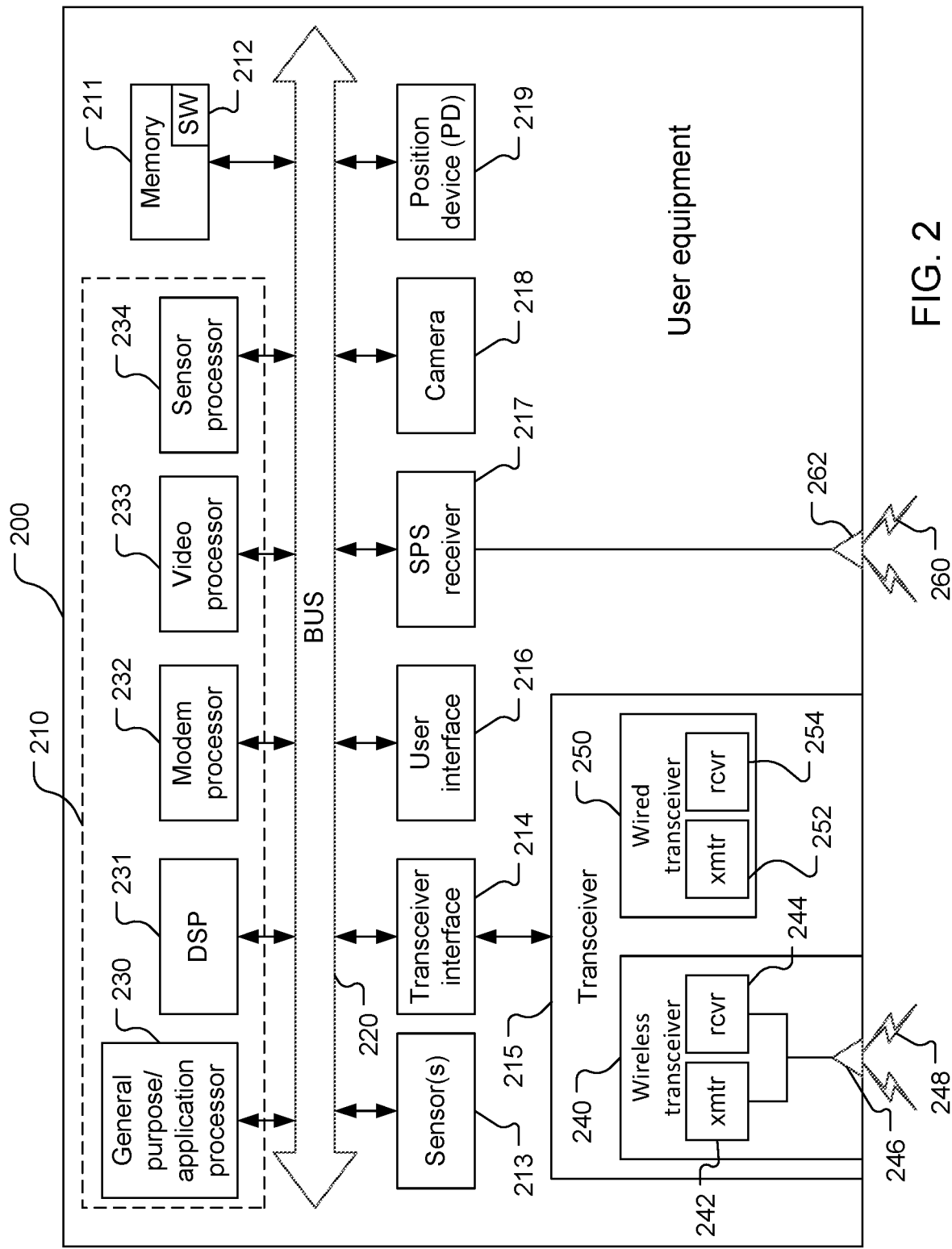
FIG. 2 is a block diagram of components of an example user equipment shown in FIG. 1.

Referring also to FIG. 2, a UE 200 is an example of one of the UEs 105, 106 and comprises a computing platform including a processor 210, memory 211 including software (SW) 212, one or more sensors 213, a transceiver interface 214 for a transceiver 215 (that includes a wireless transceiver 240 and/or a wired transceiver 250), a user interface 216, a Satellite Positioning System (SPS) receiver 217, a camera 218, and a position device (PD) 219. The processor 210, the memory 211, the sensor(s) 213, the transceiver interface 214, the user interface 216, the SPS receiver 217, the camera 218, and the position device 219 may be communicatively coupled to each other by a bus 220 (which may be configured, e.g., for optical and/or electrical communication). One or more of the shown apparatus (e.g., the camera 218, the position device 219, and/or one or more of the sensor(s) 213, etc.) may be omitted from the UE 200. The processor 210 may include one or more intelligent hardware devices, e.g., a central processing unit (CPU), a microcontroller, an application specific integrated circuit (ASIC), etc. The processor 210 may comprise multiple processors including a general-purpose/application processor 230, a Digital Signal Processor (DSP) 231, a modem processor 232, a video processor 233, and/or a sensor processor 234. One or more of the processors 230-234 may comprise multiple devices (e.g., multiple processors). For example, the sensor processor 234 may comprise, e.g., processors for RF (radio frequency) sensing (with one or more (cellular) wireless signals transmitted and reflection(s) used to identify, map, and/or track an object), and/or ultrasound, etc. The modem processor 232 may support dual SIM/dual connectivity (or even more SIMs). For example, a SIM (Subscriber Identity Module or Subscriber Identification Module) may be used by an Original Equipment Manufacturer (OEM), and another SIM may be used by an end user of the UE 200 for connectivity. The memory 211 is a non-transitory storage medium that may include random access memory (RAM), flash memory, disc memory, and/or read-only memory (ROM), etc. The memory 211 stores the software 212 which may be processor-readable, processor-executable software code containing instructions that are configured to, when executed, cause the processor 210 to perform various functions described herein. Alternatively, the software 212 may not be directly executable by the processor 210 but may be configured to cause the processor 210, e.g., when compiled and executed, to perform the functions. The description may refer only to the processor 210 performing a function, but this includes other implementations such as where the processor 210 executes software and/or firmware. The description may refer to the processor 210 performing a function as shorthand for one or more of the processors 230-234 performing the function. The description may refer to the UE 200 performing a function as shorthand for one or more appropriate components of the UE 200 performing the function. The processor 210 may include a memory with stored instructions in addition to and/or instead of the memory 211. Functionality of the processor 210 is discussed more fully below.

The configuration of the UE 200 shown in FIG. 2 is an example and not limiting of the disclosure, including the claims, and other configurations may be used. For example, an example configuration of the UE includes one or more of the processors 230-234 of the processor 210, the memory 211, and the wireless transceiver 240. Other example configurations include one or more of the processors 230-234 of the processor 210, the memory 211, the wireless transceiver 240, and one or more of the sensor(s) 213, the user interface 216, the SPS receiver 217, the camera 218, the PD 219, and/or the wired transceiver 250.

The UE 200 may comprise the modem processor 232 that may be capable of performing baseband processing of signals received and down-converted by the transceiver 215 and/or the SPS receiver 217. The modem processor 232 may perform baseband processing of signals to be upconverted for transmission by the transceiver 215. Also or alternatively, baseband processing may be performed by the processor 230 and/or the DSP 231. Other configurations, however, may be used to perform baseband processing.

The transceiver 215 may include a wireless transceiver 240 and a wired transceiver 250 configured to communicate with other devices through wireless connections and wired connections, respectively. For example, the wireless transceiver 240 may include a wireless transmitter 242 and a wireless receiver 244 coupled to one or more antennas 246 for transmitting (e.g., on one or more uplink channels and/or one or more sidelink channels) and/or receiving (e.g., on one or more downlink channels and/or one or more sidelink channels) wireless signals 248 and transducing signals from the wireless signals 248 to wired (e.g., electrical and/or optical) signals and from wired (e.g., electrical and/or optical) signals to the wireless signals 248. Thus, the wireless transmitter 242 may include multiple transmitters that may be discrete components or combined/integrated components, and/or the wireless receiver 244 may include multiple receivers that may be discrete components or combined/integrated components. The wireless transceiver 240 may be configured to communicate signals (e.g., with TRPs and/or one or more other devices) according to a variety of radio access technologies (RATs) such as 5G New Radio (NR), GSM (Global System for Mobiles), UMTS (Universal Mobile Telecommunications System), AMPS (Advanced Mobile Phone System), CDMA (Code Division Multiple Access), WCDMA (Wideband CDMA), LTE (Long-Term Evolution), LTE Direct (LTE-D), 3GPP LTE-V2X (PC5), IEEE 802.11 (including IEEE 802.11p), WiFi, WiFi Direct (WiFi-D), Bluetooth®, Zigbee etc. New Radio may use mm-wave frequencies and/or sub-6 GHz frequencies. The wired transceiver 250 may include a wired transmitter 252 and a wired receiver 254 configured for wired communication, e.g., a network interface that may be utilized to communicate with the NG-RAN 135 to send communications to, and receive communications from, the NG-RAN 135. The wired transmitter 252 may include multiple transmitters that may be discrete components or combined/integrated components, and/or the wired receiver 254 may include multiple receivers that may be discrete components or combined/integrated components. The wired transceiver 250 may be configured, e.g., for optical communication and/or electrical communication. The transceiver 215 may be communicatively coupled to the transceiver interface 214, e.g., by optical and/or electrical connection. The transceiver interface 214 may be at least partially integrated with the transceiver 215. The wireless transmitter 242, the wireless receiver 244, and/or the antenna 246 may include multiple transmitters, multiple receivers, and/or multiple antennas, respectively, for sending and/or receiving, respectively, appropriate signals.

The SPS receiver 217 (e.g., a Global Positioning System (GPS) receiver) may be capable of receiving and acquiring SPS signals 260 via an SPS antenna 262. The antenna 262 is configured to transduce the wireless SPS signals 260 to wired signals, e.g., electrical or optical signals, and may be integrated with the antenna 246. The SPS receiver 217 may be configured to process, in whole or in part, the acquired SPS signals 260 for estimating a location of the UE 200. For example, the SPS receiver 217 may be configured to determine location of the UE 200 by trilateration using the SPS signals 260. The general-purpose processor 230, the memory 211, the DSP 231 and/or one or more specialized processors (not shown) may be utilized to process acquired SPS signals, in whole or in part, and/or to calculate an estimated location of the UE 200, in conjunction with the SPS receiver 217. The memory 211 may store indications (e.g., measurements) of the SPS signals 260 and/or other signals (e.g., signals acquired from the wireless transceiver 240) for use in performing positioning operations. The general-purpose processor 230, the DSP 231, and/or one or more specialized processors, and/or the memory 211 may provide or support a location engine for use in processing measurements to estimate a location of the UE 200.

Figure 3:
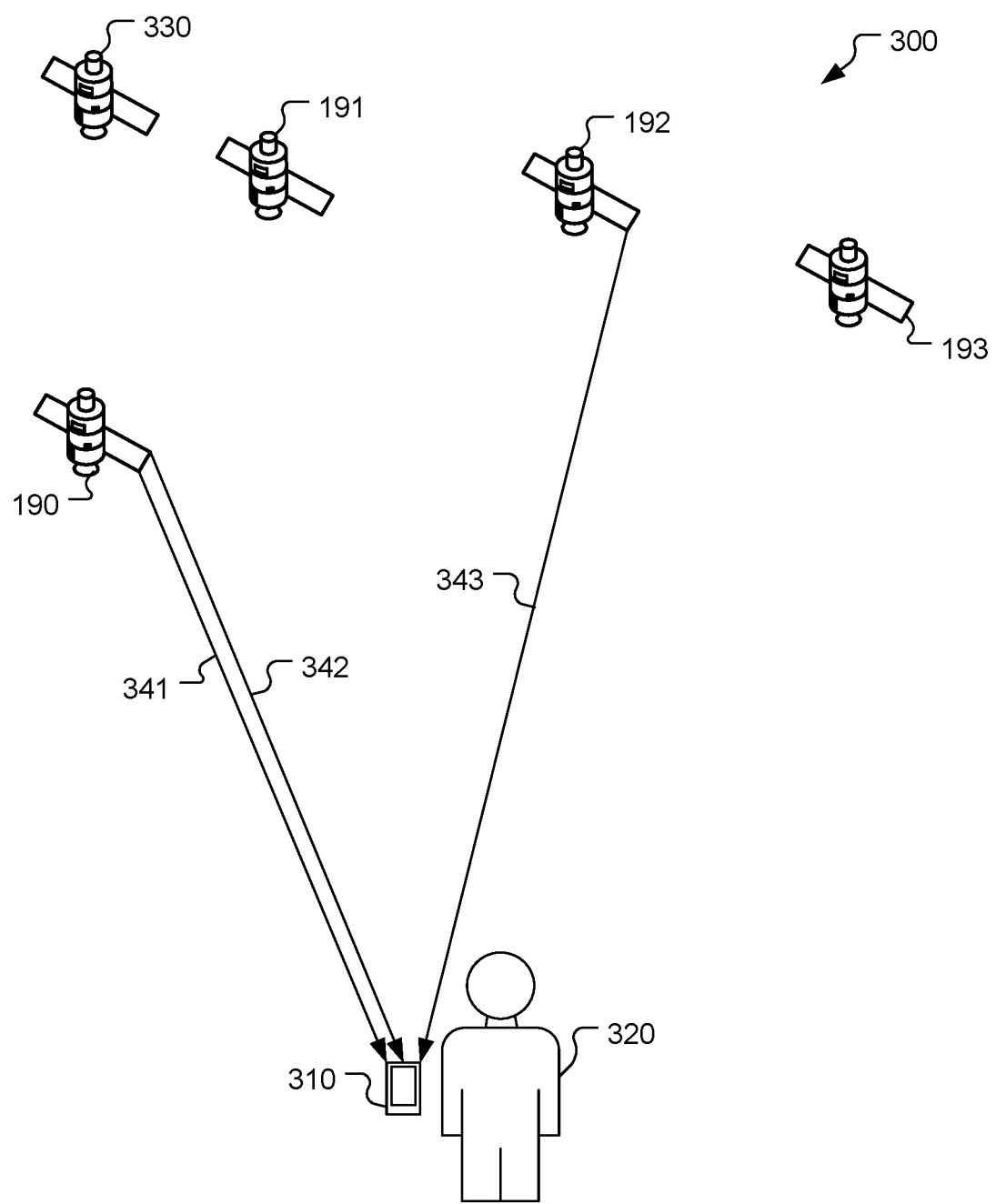
FIG. 3 is a simplified diagram of a navigation environment.

The position device (PD) 219 may be configured to determine a position of the UE 200, motion of the UE 200, and/or relative position of the UE 200, and/or time. For example, the PD 219 may communicate with, and/or include some or all of, the SPS receiver 217. The PD 219 may work in conjunction with the processor 210 and the memory 211 as appropriate to perform at least a portion of one or more positioning methods, although the description herein may refer only to the PD 219 being configured to perform, or performing, in accordance with the positioning method(s). The PD 219 may also or alternatively be configured to determine location of the UE 200 using terrestrial-based signals (e.g., at least some of the signals 248) for trilateration, for assistance with obtaining and using the SPS signals 260, or both. The PD 219 may be configured to use one or more other techniques (e.g., relying on the UE's self-reported location (e.g., part of the UE's position beacon)) for determining the location of the UE 200, and may use a combination of techniques (e.g., SPS and terrestrial positioning signals) to determine the location of the UE 200. The PD 219 may include one or more of the sensors 213 (e.g., gyroscope(s), accelerometer(s), magnetometer(s), etc.) that may sense orientation and/or motion of the UE 200 and provide indications thereof that the processor 210 (e.g., the processor 230 and/or the DSP 231) may be configured to use to determine motion (e.g., a velocity vector and/or an acceleration vector) of the UE 200. The PD 219 may be configured to provide indications of uncertainty and/or error in the determined position and/or motion. Functionality of the PD 219 may be provided in a variety of manners and/or configurations, e.g., by the general purpose/application processor 230, the transceiver 215, the SPS receiver 217, and/or another component of the UE 200, and may be provided by hardware, software, firmware, or various combinations thereof Adaptive Gain Signal Processing Referring also to FIG. 3, in a navigation environment 300, a UE 310 associated with (e.g., held by) a user 320 may receive satellite signals from the satellites 190-193 and one or more other satellites such as a satellite 330. The satellites 190-193 are members of a satellite constellation, i.e., a group of satellites that are part of a system, e.g., controlled by a common entity such as a government, and orbiting in complementary orbits to facilitate determining positions of entities around the world. The satellite 330 is a member of a different constellation than the constellation of which the satellites 190-193 are members. The satellites 190-193 may be, for example, members of the BPS, Galileo, Beidou, GLONASS, or QZSS constellation. The satellites 190-193 may each transmit multiple satellite signals in different frequency bands, e.g., the satellite 190 may transmit a satellite signal 341 and a satellite signal 342 that have frequencies in different frequency bands, e.g., L1 and L2/L5 frequency bands, the satellites 191 and 193 may transmit signals in the same frequency bands (not shown), and a satellite signal 343 from the satellite 192 may have a frequency in only one frequency band, e.g., the L1 frequency band.

Figure 4:
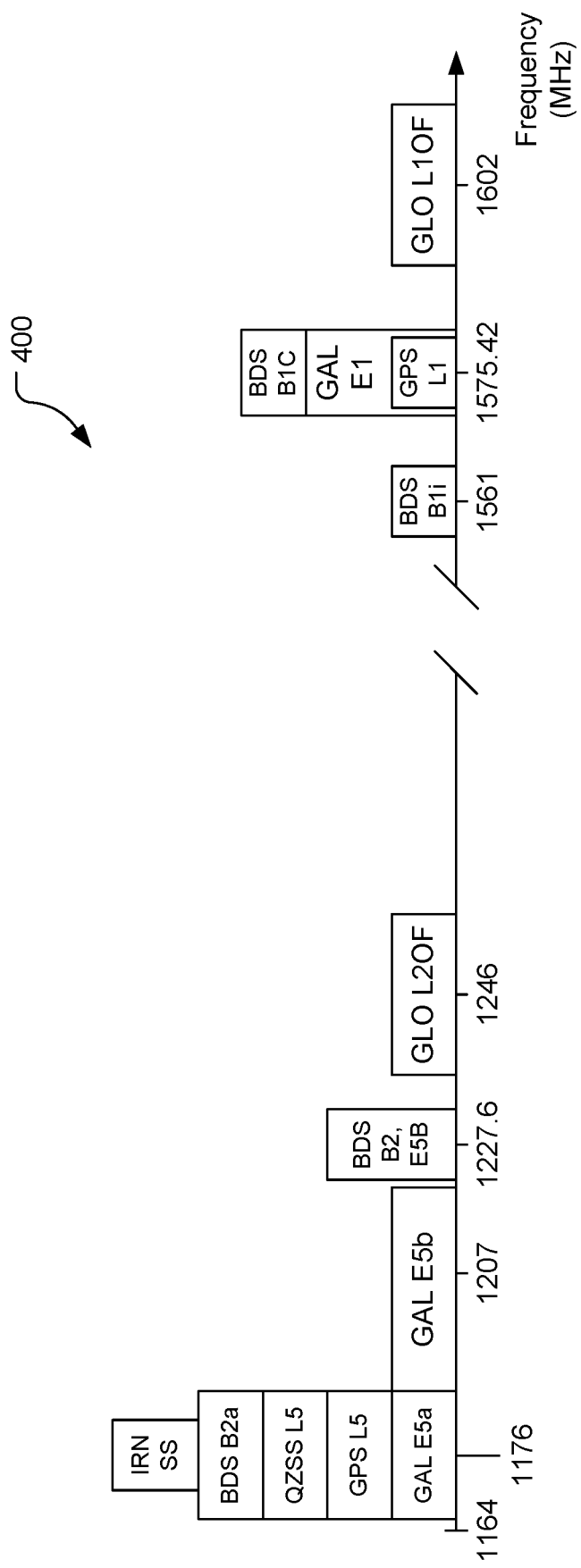
FIG. 4 is a frequency band plot of satellite signals and frequencies of the satellite signals.

Referring also to FIG. 4 (which, like other figures, is not shown to scale), a frequency band plot 400 shows that GNSS constellations operate on several frequencies in the L-Band. The L1 frequency band typically covers frequencies from 1559 MHz to 1606 MHz and includes L1 signals from GPS, Galileo, Beidou, GLONASS, and QZSS GNSS constellations. These same constellations also transmit concurrently using another frequency in the L2 frequency band and/or the L5 frequency band. The L2 and L5 signals may complement the L1 signals, which have been used for many years. For example, the L5 signals have wider signal bandwidth than the L1 signals, which helps improve positioning performance in multi-path environments. Also, using the L5 signals in addition to the L1 signals provides frequency diversity. The L2 and L5 signals are far enough away in frequency from the L1 signals that different receive chains may be used to measure the L2 and L5 signals versus the L1 signals. While the discussion herein focuses on the L1, L2, and L5 bands, the discussion (including the claims) are not limited to these bands, nor is the discussion limited to the use of satellite signals in two or three bands.

Figure 5:
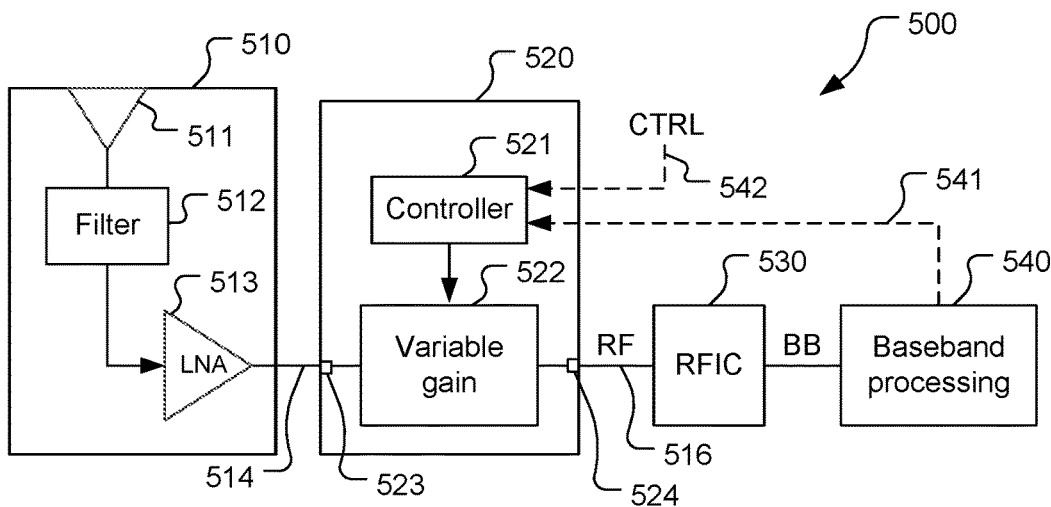
FIG. 5 is a block diagram of an example signal receiving system.

Referring to FIG. 5, a signal receiving system 500 (e.g., for receiving communication signals and/or GNSS signals) includes an antenna sub-system 510, a signal preconditioner 520, an RFIC 530 (radio frequency integrated circuit), and a baseband processing block 540. The signal receiving system 500 may be disposed in, or be part of, a larger device such as a UE, e.g., a tablet computer, a vehicle UE, a cellular phone, etc. The signal receiving system 500 is configured to receive wireless RF signals and process the wireless RF signals into baseband wire-conducted signals, e.g., to determine measurements of the signals and/or to decode information in the signals. The antenna sub-system 510 includes an antenna 511, a filter 512, and an LNA 513 (low-noise amplifier). The antenna 511 may include one or more antennas, e.g., for receiving signals having frequencies in different frequency bands (e.g., L1 and L2/L5). The filter 512 may comprise one or more filters such as band-pass filters for passing signals of desired frequencies and rejecting other signals. Separate filters may be provided for different antennas. The LNA 513 may include one or more LNAs, e.g., an LNA for each antenna-filter combination. The preconditioner 520 is configured to provide a variable gain (e.g., positive gain and/or negative gain (attenuation)) such that an RF signal 525 output by the signal preconditioner is within a dynamic range of the RFIC 530. The dynamic range of the RFIC 530 is an energy range (e.g., a power range, a voltage range, or a current range) of an input signal to the RFIC 530 that is acceptable or usable by the RFIC 530, e.g., that can be brought by the RFIC 530 within a range for linear operation of one or more components of the RFIC 530 (i.e., such that one or more components of the RFIC 530 operate linearly (e.g., in a range of linear slope of input energy to output energy)). The dynamic range of the RFIC 530 may be quantified in terms of power (or voltage or current) and/or in terms of gain (e.g., if input power to the system 500 is known such as for GNSS signals at Earth's surface that are known to have powers of approximately −130 dBm). The RFIC 530 is configured to convert received analog RF signals into digital baseband signals and provide the digital baseband signals to the baseband processing block 540. The baseband processing block 540 comprises one or more processors and is configured to process the baseband signals to determine signal measurements and/or to decode information. For example, the baseband processing block 540 may be configured to perform intense signal processing of correlating the digital baseband signals output by the RFIC 530 with respective reference pseudorandom signals (e.g., pseudorandom noise codes) by integrating the digital baseband signals (e.g., for 1 ms) and dumping the integrated signals for further processing to determine whether the correlation results have sufficient energy to indicate a true signal. Also or alternatively, the baseband processing block 540 may be configured to perform one or more computations on the digital baseband signals output by the RFIC 530 to determine one or more signal parameters (e.g., pseudorange, CNo (carrier-to-noise-density ratio), Doppler, carrier phase, etc. corresponding to satellite signals received by the antenna sub-system 510).

Figure 6:
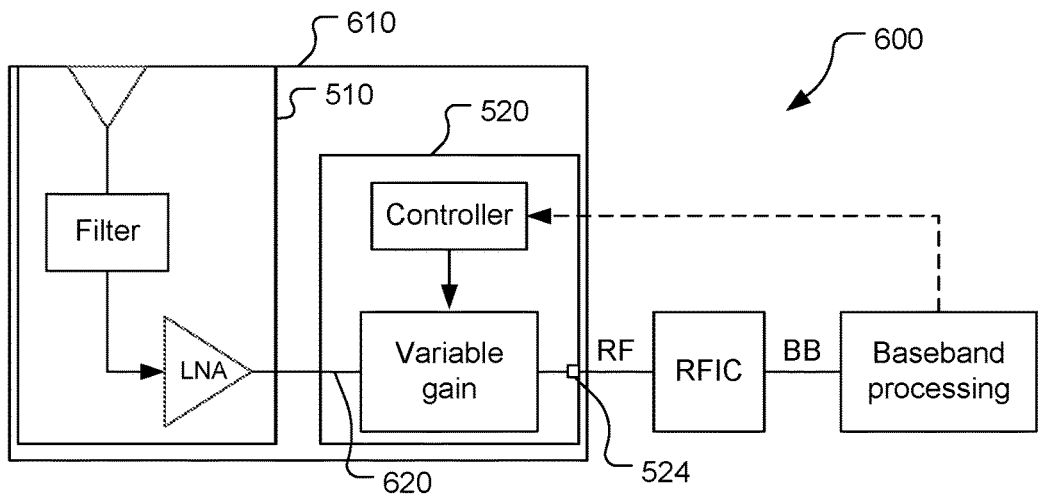
FIG. 6 is a block diagram of another example signal receiving system.
Figure 7:
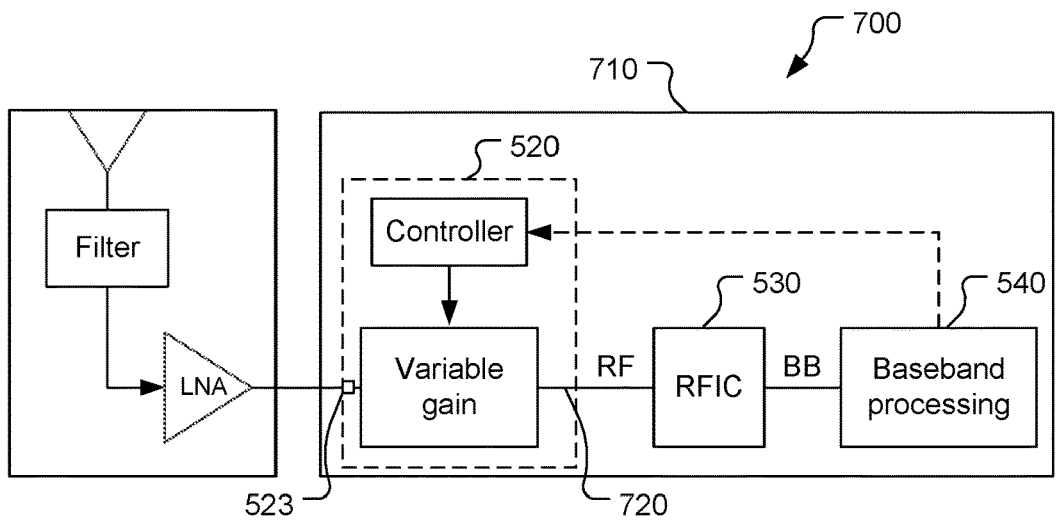
FIG. 7 is a block flow diagram of another example signal receiving system.

In the system shown in FIG. 5, the signal preconditioner 520 is a standalone unit between the antenna sub-system 510 and the RFIC 530. Other configurations, however, may be used. For example, as shown in FIG. 6, in a signal receiving system 600 the signal preconditioner 520 may be integrated with the antenna sub-system 510, e.g., with the signal preconditioner 520 and the antenna sub-system 510 disposed on a single monolithic substrate 610, e.g., a single printed circuit board, or comprising portions of a single integrated circuit. As another example, as shown in FIG. 7, in a signal receiving system 700 the signal preconditioner 520 may be integrated with the RFIC 530 and the baseband processing block 540, e.g., with the signal preconditioner 520, the RFIC 530, and the baseband processing block 540 disposed on a single monolithic substrate 710, e.g., a single printed circuit board (PCB), or comprising portions of a single integrated circuit. In each of the configurations shown in FIGS. 5-7, the signal preconditioner 520 is outside of and upstream of (for signals received by the antenna sub-system 510) of the RFIC 530. In each of the configurations shown in FIGS. 5-7, the RFIC 530 may be connected to and work with different antenna systems, e.g., with different gains, while accommodating the dynamic range of the RFIC 530. In each of the configurations shown in FIGS. 5-7, the RFIC 530 may be connected to antennas by different transmission lines (e.g., coaxial cables) with different amounts of attenuation, while accommodating the dynamic range of the RFIC 530. For example, the signal receiving system 700 enables a single PCB to be connected to and work with different antenna systems, e.g., with different gains, and to antennas by transmission lines with different amounts of attenuation, while accommodating the dynamic range of the RFIC 530.

Figure 8:
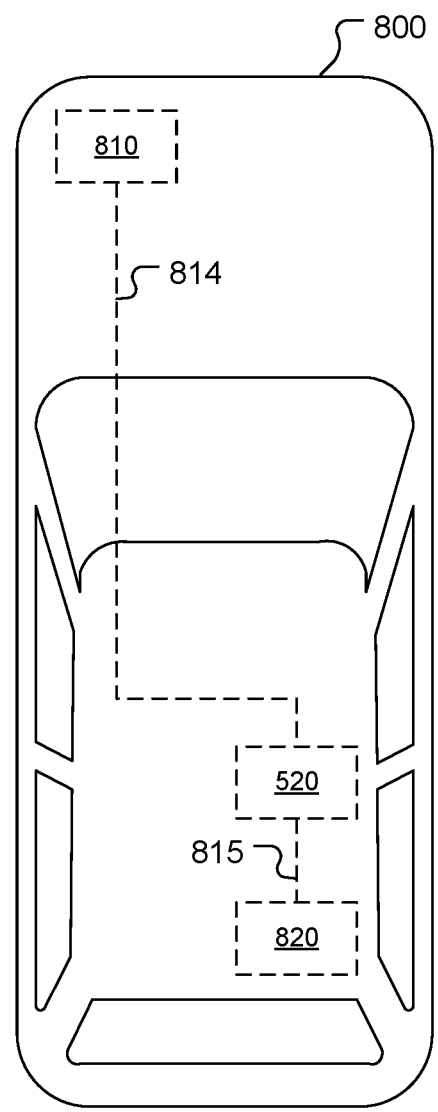
FIG. 8 is a simplified diagram of a vehicle with a distributed signal receiving system.

Different antenna sub-systems 510 may introduce different amounts of gain (positive and/or negative) to received signals. For example, different antennas 511 may introduce different amounts of positive gain (e.g., through directionality of the antennas 511) and/or negative gain (attenuation) converting from wireless signals to wired signals. Different filters 512 may introduce different amounts of negative gain and different LNAs 513 may introduce different amounts of positive gain, e.g., up to 6 dB different. Further, different lengths of transmission lines 514 (e.g., coaxial cables) connecting the antenna sub-system 510 to the signal preconditioner 520 may introduce different amounts of negative gain, e.g., up to 10 dB for automotive applications, or even more. For example, referring to FIG. 8, the signal receiving system 500 may be installed in a vehicle 800, with one antenna sub-system 810 installed far away from the signal preconditioner 520 and thus connected to the signal preconditioner by a long transmission line 814 and another antenna sub-system 820 may be installed near the signal preconditioner 520 and connected to the signal preconditioner with a short transmission line 815. The long transmission line 814 may introduce more attenuation than the short transmission line 815, e.g., up to 10 dB more. Thus, different antenna sub-systems and different transmission line lengths may yield gain differences of up to 24 dB (e.g., for automotive applications) or more. Further, different RFICs 530 may have different dynamic ranges, with the dynamic ranges being relatively small, e.g., 10 dB or less. While the RFIC 530 may be configured to provide some gain adjustment (e.g., including one or more variable amplifiers and/or one or more variable attenuators), the range of gain adjustment is small, e.g., 10 dB or less, and is based on monitoring of one or more signals within the RFIC 530.

The signal preconditioner 520 may be configured to introduce any of a wide range of gains to a signal received from the antenna sub-system in order to provide a signal to the RFIC 530 that is within the dynamic range of the RFIC 530 in view of different possible antenna sub-systems 510, different possible lengths of the transmission line 514, and/or different dynamic ranges of RFICs 530. The signal preconditioner 520 provides coarse gain adjustment for signals received by the antenna sub-system 510 before being provided to the RFIC 530, which may provide fine gain adjustment. A range of gains providable by the signal preconditioner 520 is larger than the dynamic range (in terms of gain) of the RFIC 530. For example, the range of gains that the signal preconditioner 520 is configured to provide may be 10 dB or more, e.g., 15 dB or more, 20 dB or more, 25 dB or more, 30 dB or more, etc. To provide different gains, the signal preconditioner 520 may comprise a controller 521 and a variable gain circuit 522. The variable gain circuit 522 may include one or more variable amplifiers to introduce positive gain and/or one or more variable attenuators to introduce negative gain.

Figure 9:
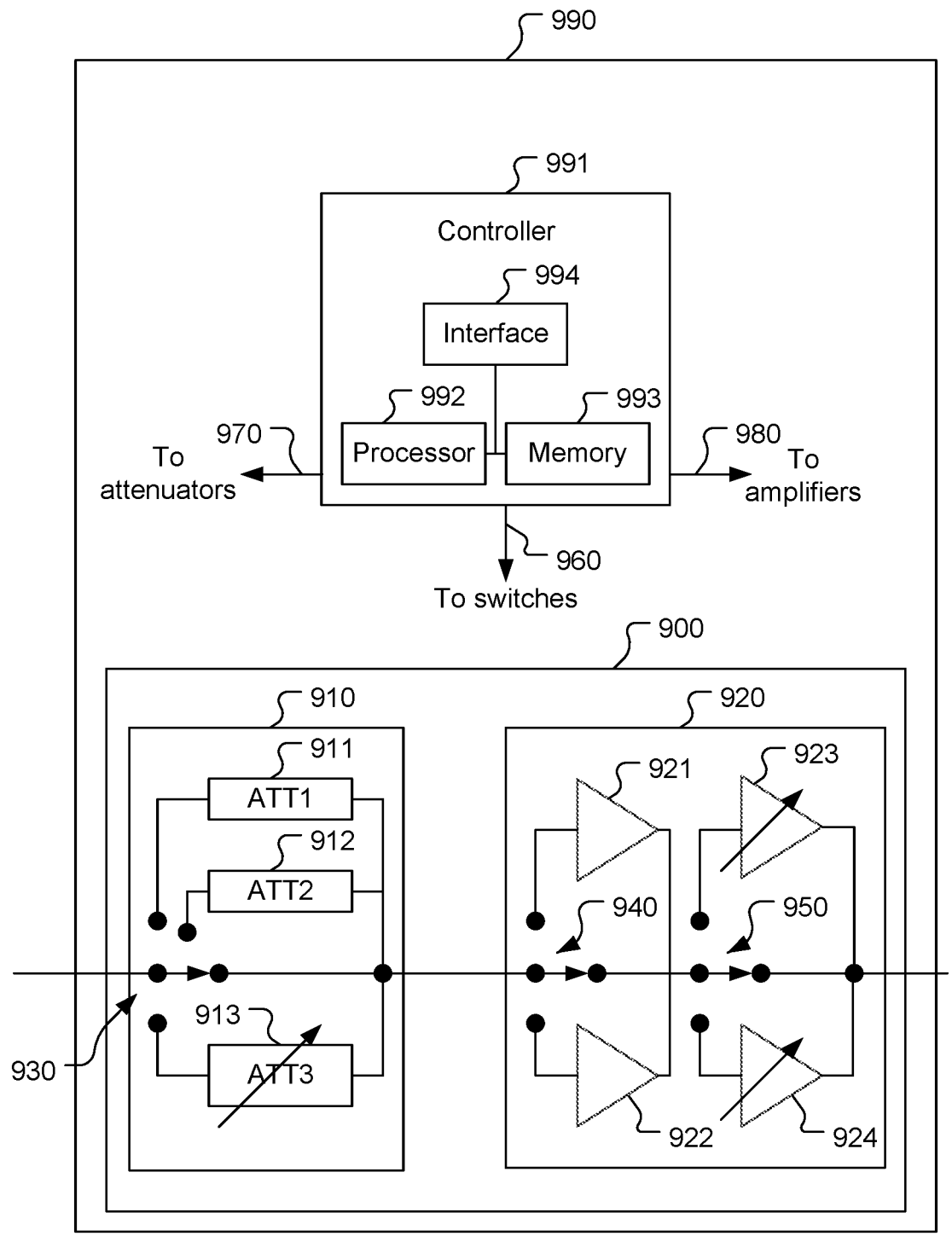
FIG. 9 is a block diagram of an example of a signal preconditioner shown in FIG. 5.

Any number of different configurations of the variable gain circuit 522 may be used. For example, referring also to FIG. 9, an example signal preconditioner 990 includes a controller 991 and a variable gain circuit 900 that is an example of the variable gain circuit 522. The variable gain circuit 900 includes a variable attenuator 910 and a variable amplifier 920. The variable attenuator 910 may include one or more fixed attenuators, here fixed attenuators 911, 912, that may be selected for use by the controller 991 and/or one or more variable attenuators, here a variable attenuator 913, that may be selected for use, and whose attenuator value(s) may be selected, by the controller 991. The controller 991 may control a switch 930 to select one, or none, of the attenuators 911-913. The variable amplifier 920 may include one or more fixed-gain amplifiers, here fixed-gain amplifiers 921, 922, that may be selected for use by the controller 991/or one or more variable-gain amplifiers, here variable-gain amplifiers 923, 924, that may be selected for use, and whose gain values may be set, by the controller 991. The controller 991 may control a switch 940 to select one, or none, of the fixed-gain amplifiers 921, 922 and may control a switch 950 to select one, or none, of the variable-gain amplifiers 923, 924. The controller 991 may control each of the switches 930, 940, 950 with a respective one of control signals 960, may set the attenuation value of a selected variable attenuator with a control signal 970, and may set value of a selected variable-gain amplifier with a control signal 980.

The controller 991 includes a processor 992, a memory 993, and an interface 994 communicatively coupled to each other by a bus. The processor 992 may include one or more components of the processor 210 and is configured to control the variable gain circuit 900. The interface 994 is configured to receive one or more control signals from the baseband processing block 540. The memory 993 may be configured similarly to the memory 211, e.g., including software with processor-readable instructions configured to cause the processor 992 to perform functions for controlling the variable gain circuit 900.

The description herein may refer only to the processor 992 performing a function, but this includes other implementations such as where the processor 992 executes software (stored in the memory 993) and/or firmware. The description herein may refer to the signal preconditioner 990 (or the signal preconditioner 520) performing a function as shorthand for one or more appropriate components (e.g., the processor 992 and the memory 993) performing the function.

Figure 10:
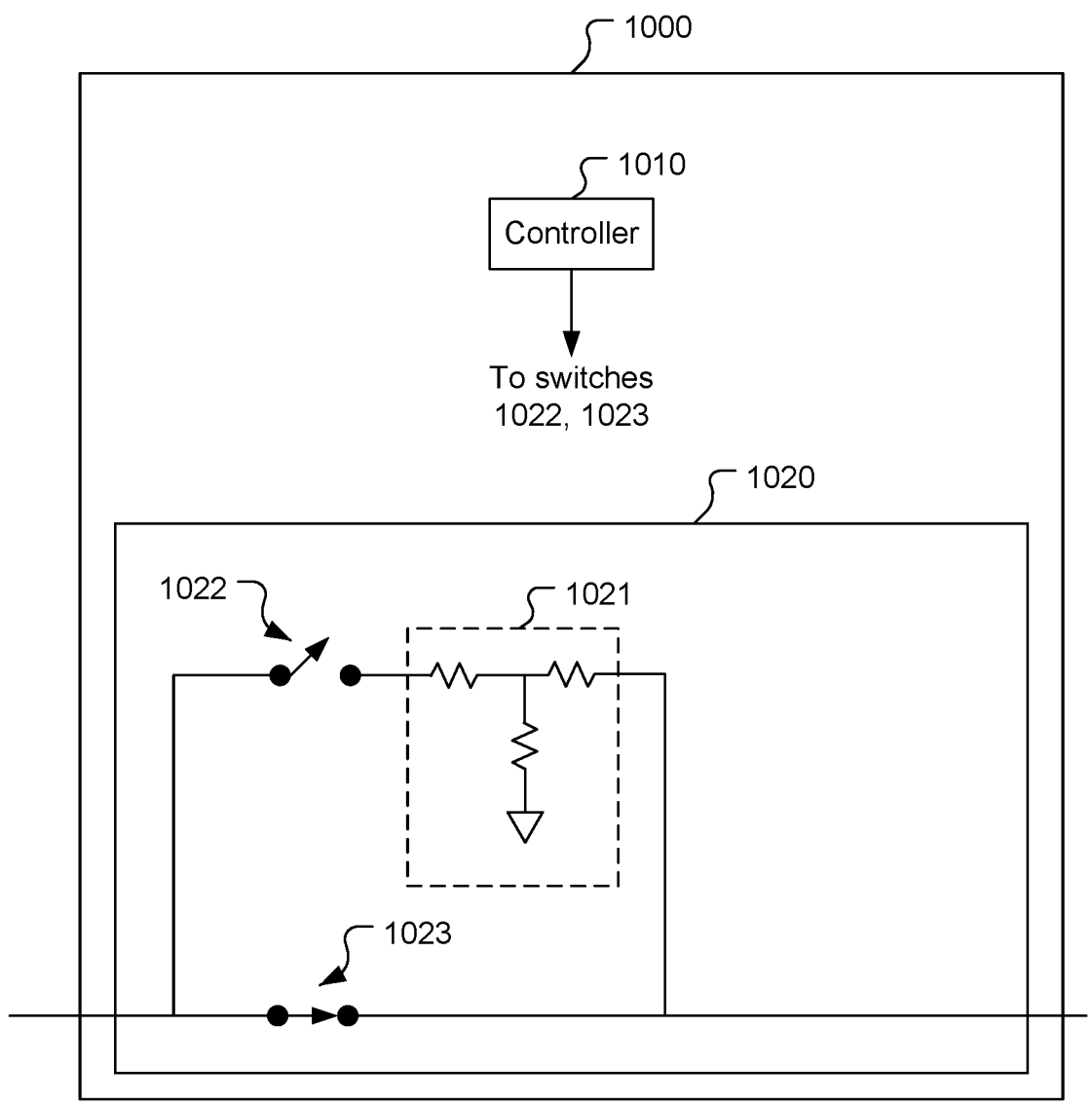
FIG. 10 is a block diagram of an example of a signal preconditioner shown in FIG. 5.

Referring also to FIG. 10, another example signal preconditioner 1000 includes a controller 1010 and a variable gain circuit 1020 that is an example of the variable gain circuit 522. The variable gain circuit 1020 includes a single fixed attenuator comprising a resistor network 1021, a switch 1022 to selectively use the resistor network 1021, and a switch 1023 to selectively bypass the resistor network 1021, with the switches 1022, 1023 being complementary, the switch 1022 closed when the switch 1023 is open and vice versa.

Referring in particular again to FIG. 5, the baseband processing block 540 may be configured to provide one or more control signals 541 to the signal preconditioner 520. For example, the baseband processing block 540, which contains appropriate processing components (e.g., a processor and memory with instructions for controlling the processor, and/or firmware) may be configured to determine one or more metrics of signal power at the baseband processing block 540. The baseband processing block 540 may provide one or more indications of the metric(s) in the control signal(s) 541. Also or alternatively, the baseband processing block 540 may be configured to determine, based on the metric(s), whether the RFIC 530 is undersaturated or oversaturated and produce and provide one or more appropriate control signals to the signal preconditioner 520 to cause the signal preconditioner to adjust gain provided to one or more signals inbound to the signal preconditioner 520 such that one or more signals provided by the signal preconditioner 520 to the RFIC 530 are within the dynamic range of the RFIC 530 (so the RFIC 430 will not be undersaturated or oversaturated). The control signal(s) 541 may provide various indications. For example, a control signal 541 may provide a general indication to increase gain, or a general indication to decrease gain. As another example, the control signal(s) 541 may provide an indication of a specific amount to change the gain. As another example, the control signal(s) 541 may provide one or more indications regarding one or more frequency bands (e.g., to change gain, indicating jamming of the frequency band(s), indicating spoofing of the frequency band(s), etc.). The baseband processing block 540 may determine the jamming and/or spoofing by analyzing one or more of the received baseband signals, e.g., using one or more known techniques, which may identify interference due to external or internal causes. The baseband processing block 540 may be configured to determine jamming due to known transmission of interference by an apparatus associated with the signal receiving system 500, e.g., a vehicle. For example, the baseband processing block 540 may be configured to determine jamming due to intentional and/or unintentional interference, e.g., transmission of a communication signal (e.g., a cellular communication signal) and/or transmission or noise corresponding to operation of a device such as windshield wipers. An indication may be associated with a particular frequency band, e.g., indicating jamming in one frequency band (e.g., L1) but not another frequency band (e.g., L2/L5). The control signal(s) 541 provided by the baseband processing block 540 may provide software control of the variable gain provided by the signal preconditioner 520. Software used by the baseband processing block 540 to produce the control signal(s) 541 may be modified (updated) over time, e.g., by providing update instructions to the baseband processing block 540.

Figure 11:
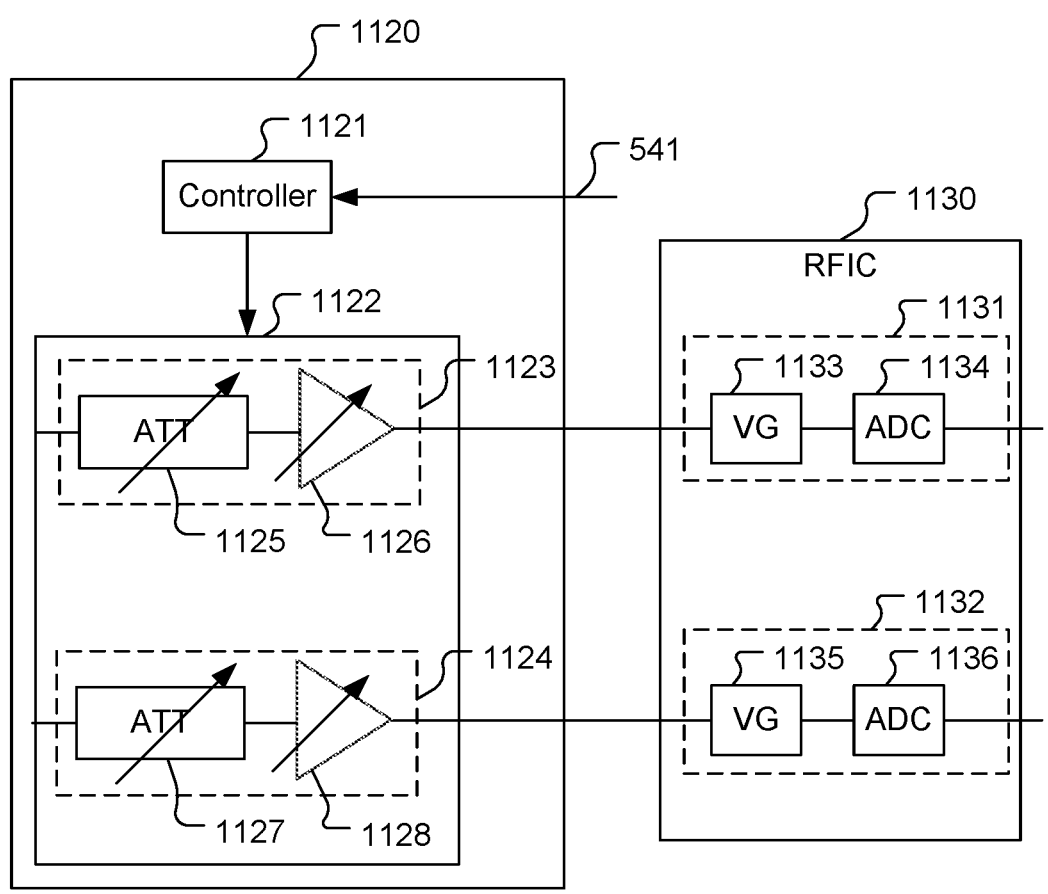
FIG. 11 is a block diagram of another example a signal preconditioner shown in FIG. 5 and an example of a radio frequency integrated circuit shown in FIG. 5 including multiple receive chains corresponding to different frequency bands.

The signal preconditioner 520 may be configured to provide gain to one or more received signals based on the control signal(s) 541 received from the baseband processing block 540. For example, the controller 521 may be configured to respond to a general indication to increase (or decrease) gain by increasing (or decreasing) gain provided by the variable gain circuit 522 by a predetermined, fixed amount, e.g., 1 dB. As another example, the controller 521 may be configured to respond to an indication to increase (or decrease) gain by a specific amount, or to a specific amount, by selecting an appropriate gain or by increasing (or decreasing) gain as appropriate by an incremental amount. As another example, the controller 521 may be configured to respond to an indication pertaining to a specified frequency band by adjusting, as appropriate, a gain provided to the specified frequency band. For example, referring also to FIG. 11, a signal preconditioner 1120, which is an example of the signal preconditioner 520, includes a controller 1121 and a variable gain circuit 1122, which are examples of the controller 521 and the variable gain circuit 522. The variable gain circuit 1122 includes multiple receive chains 1123, 1124 each corresponding to a different frequency band, i.e., configured to processing signals of different frequency bands. In this example, the receive chain 1123 includes a variable attenuator 1125 and a variable amplifier 1126, and the receive chain 1124 includes a variable attenuator 1127 and a variable amplifier 1128, although other configurations may be used, e.g., with each receive chain 1123, 1124 including one or more respective filters, e.g., bandpass filters corresponding to the respective frequency bands. In this example, an RFIC 1130 (which is an example of the RFIC 530) includes receive chains 1131, 1132 corresponding to the frequency bands of the receive chains 1123, 1124. The receive chain 1131 includes a variable gain circuit 1133 and an ADC 1134, and the receive chain 1132 includes a variable gain circuit 1135 and an ADC 1136. The ADCs 1134, 1136 have respective dynamic ranges, and comprise a component of one or more components of the receive chains 1131, 1132 that determine corresponding dynamic ranges of the receive chains 1131, 1132 and thus the dynamic range of the RFIC 1130. Receive chains may be referred to as RF paths (radio frequency paths).

Figure 12:
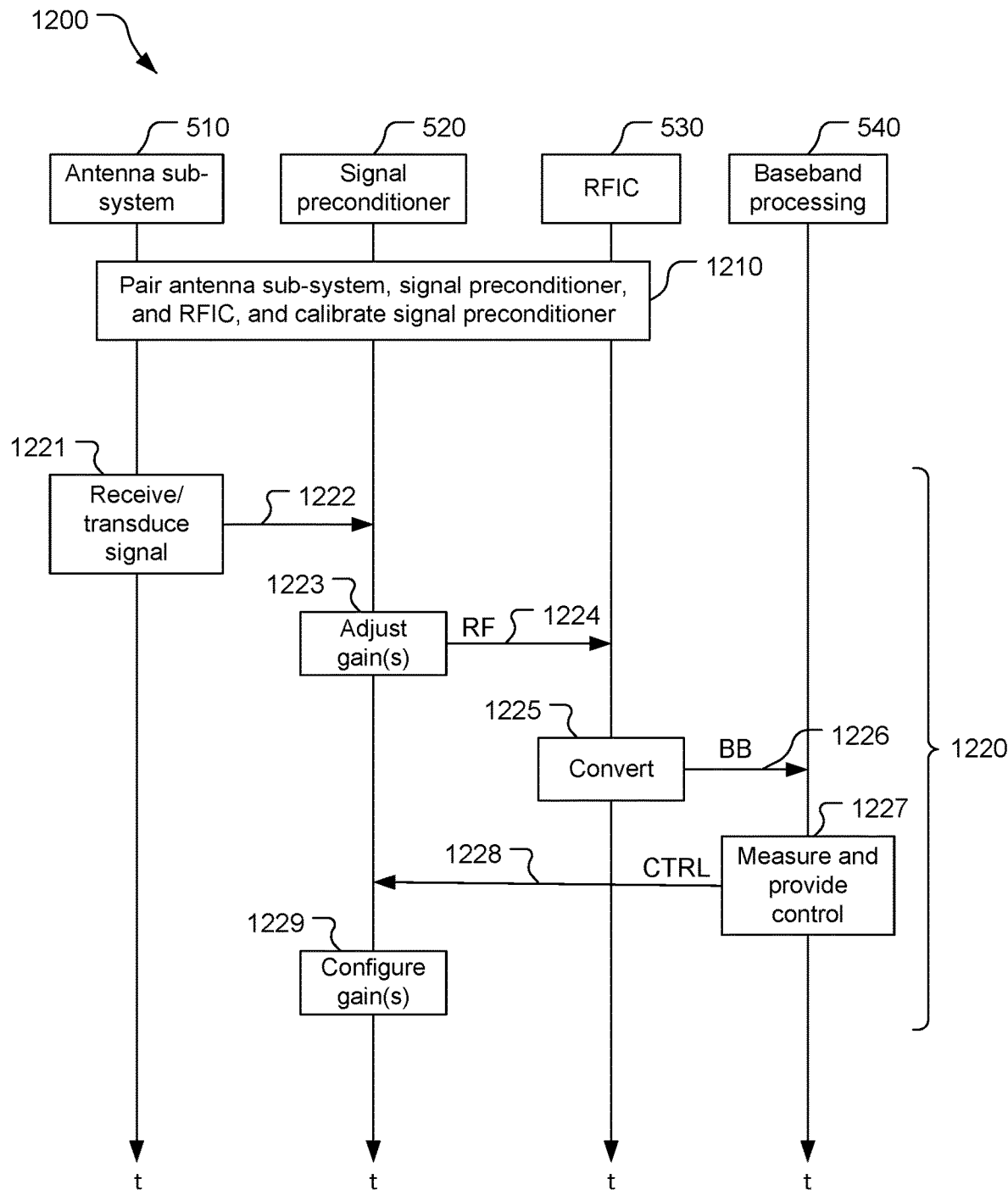
FIG. 12 is a signaling and process flow diagram of a signal preconditioner calibration method.

Referring to FIG. 12, with further reference to FIGS. 1-11, a signal preconditioner calibration method 1200 includes the stages shown. The method 1200 is, however, an example only and not limiting. The method 1200 may be altered, e.g., by having stages added, removed, rearranged, combined, performed concurrently, and/or having single stages split into multiple stages. Examples are provided below for receiving L1 and L5 satellite signals, but the disclosure is not limited to these frequency bands and is not limited to receiving (or measuring) satellite signals (also called SV signals).

At stage 1210, the signal preconditioner 520 is paired with the antenna sub-system 510 and the RFIC 530, and the signal preconditioner is calibrated to provide desired gain to one or more signals received from the antenna sub-system 510. For example, the signal preconditioner 520 may be a standalone unit as shown in FIG. 5, and may be paired with the antenna sub-system 510 during manufacture, e.g., during manufacture of the vehicle 800 the signal preconditioner 520 is connected, using one or more transmission lines, to the antenna sub-system 810 and to the antenna sub-system 820. The signal preconditioner 520 is further connected to the RFIC 530 via one or more transmission lines. As another example, the signal precondition 520 may be integrated with the antenna sub-system 510 (FIG. 6), and connected (e.g., via one or more transmission lines) to the RFIC 530. As another example, the signal preconditioner 520 may be integrated with the RFIC 530 and connected via one or more transmission lines to one or more antenna sub-systems 510.

To calibrate the signal preconditioner 520 to provide one or more desired gains, the signal preconditioner may receive one or more control signals 542 (see FIG. 5). The controller 521 may be configured to respond to the control signal(s) 542 by controlling the variable gain circuit 522 to provide one or more desired gains in accordance with the control signal(s) 542. The control signal(s) 542 may pertain to a single gain (e.g., for a single frequency band or for all frequency bands for which the signal preconditioner 520 is configured) and the controller 521 may control the variable gain circuit 522 to provide a corresponding gain. The gain set according to the control signal(s) 542 may be a static gain to be provided by the signal preconditioner 520 thereafter, without change. Alternatively, the gain set according to the control signal(s) 542 may be a default gain, or an initial gain to be modified once the signal receiving system 500 is deployed. For example, the controller 521 may cause a fixed attenuator to be selected, and/or a variable-gain attenuator to be selected and the attenuation provided by the variable-gain attenuator to be set. Also or alternatively, the controller 521 may cause a fixed-gain amplifier to be selected, and/or a variable-gain amplifier to be selected and the positive gain provided by the variable-gain amplifier to be set.

The control signal(s) 542 may explicitly or implicitly indicate the gain for the signal preconditioner 520 to apply. For example, the control signal(s) 542 may indicate a type of the antenna sub-system 510 and the controller 521 may use a look-up table to determine the gain provided by that type of antenna sub-system. As another example, the control signal(s) 542 may indicate a transmission line length and transmission line type used to connect the antenna sub-system 510 to the signal preconditioner 520. The controller 521 may use this information and a look-up table of transmission line attenuations to determine the attenuation of the transmission line. As another example, the control signal(s) may indicate a type of the RFIC 530 and the controller 521 may use a look-up table of RFICs to determine the dynamic range of the RFIC 530. As another example, the control signal(s) 542 may indicate a gain of the antenna sub-system 510, a gain (i.e., negative gain) of a transmission line connecting the antenna sub-system 510 and the signal preconditioner 520, and/or the dynamic range of the RFIC 530. The controller 521 may combine information (implicit and/or explicit) regarding the gains of the antenna sub-system 510 and connection of the antenna sub-system 510 to the signal preconditioner 520, and the dynamic range of the RFIC 530 to determine the gain to be provided by the signal preconditioner 520 and thus the gain to be selected by the controller 521 for the variable gain circuit 522 to provide. Information for multiple antenna sub-systems 510, multiple receive chains of the antenna sub-system 510 (e.g., multiple antennas and corresponding filter(s) and/or LNA(s)), multiple transmission lines, and/or multiple receive chains of the RFIC 530 may be used by the controller 521 to determine the gain(s) to be provided by the signal preconditioner 520.

At stage 1220, which may be performed in addition to or instead of stage 1210, the signal preconditioner 520 is dynamically configured to provide one of a multitude of available gains to incoming signals to produce outbound signals to be provided to the RFIC 530. At sub-stage 1221, the antenna sub-system 510 receives and transduces one or more wireless signals (e.g., SV signals, cellular signals, etc.) into one or more wired signals and transmits wired signal(s) 1222 to the signal preconditioner 520. At sub-stage 1223, the signal preconditioner 520 provides one or more gains (net positive or net negative or zero gain) as appropriate (e.g., as previously configured) to the wired signal(s) 1222 and provides one or more RF signals 1224 to the RFIC 530. At sub-stage 1225, the RFIC 530 converts the RF signal(s) 1224 to one or more digital baseband signals 1226 that the RFIC 530 provides to the baseband processing unit 540. At sub-stage 1227, the baseband processing unit 540 determines one or more metrics (e.g., performs one or more measurements) and determines whether gain of the wired signal(s) 1222 should be adjusted. The baseband processing unit 540 transmits one or more control signals 1228 to the signal preconditioner 520 indicative of whether to reconfigure the gain(s) provided by the signal preconditioner 520, e.g., based on the metric(s) indicating that the RFIC 530 is undersaturated or oversaturated (e.g., one or more signals provided to one or more components of the RFIC 530 is(are) outside the dynamic range(s) of the component(s)). The control signal(s) 1228 may be indicative of the metric(s) that the signal preconditioner 520 can interpret to determine appropriate change to the gain(s) provided by the signal preconditioner 520, may indicate to increase one or more gains (e.g., for one or more indicated frequency bands, e.g., L1 and/or L2/L5), may indicate to decrease one or more gains (e.g., for one or more indicated frequency bands), and/or may indicate one or more specific gains (e.g., for one or more indicated frequency bands), etc. At sub-stage 1229, the signal preconditioner 520, e.g., the controller 521, reconfigures the variable gain circuit 522 as appropriate based on the control signal(s) 1228 to provide one or more appropriate gains to one or more signals from the antenna sub-system 510 (e.g., one or more antenna sub-systems) to help ensure that the RF signal(s) 1224 provided to the RFIC 530 are within the dynamic range of the RFIC 530.

Figure 13:
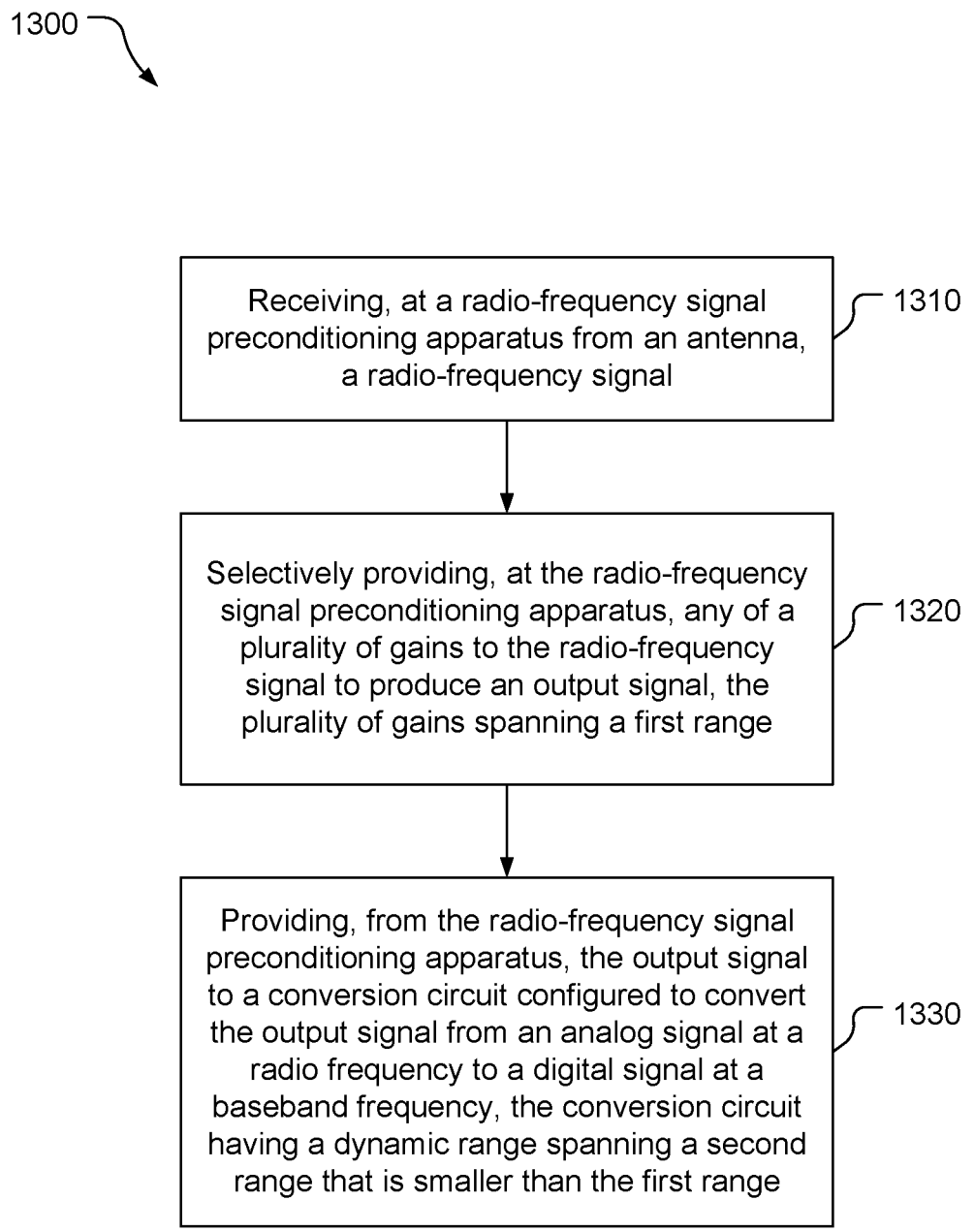
FIG. 13 is a block diagram of a radio-frequency signal preconditioning method.

Referring to FIG. 13, with further reference to FIGS. 1-12, a radio-frequency signal preconditioning method 1300 includes the stages shown. The method 1300 is, however, an example only and not limiting. The method 1300 may be altered, e.g., by having stages added, removed, rearranged, combined, performed concurrently, and/or having single stages split into multiple stages. Examples are provided below for receiving L1 and L5 signals, but the disclosure is not limited to these frequency bands and is not limited to receiving (or measuring) two satellite signal (also called SV signals).

At stage 1310, the method 1300 includes receiving, at a radio-frequency signal preconditioning apparatus from an antenna, a radio-frequency signal. For example, the signal preconditioner 520 receives one or more RF signals, e.g., the wired signal(s) 1222, from the antenna sub-system 510. A conductive mechanical input 523 configured to couple to the transmission line 514 may comprise means for receiving the RF signal, e.g., for a standalone configuration of the signal preconditioner 520 shown in FIG. 5 or the configuration shown in FIG. 7 with the signal preconditioner 520 integrated with the RFIC 530 and the baseband processing block 540. A conductive line 620, e.g., a transmission line, or an input to a component of the variable gain circuit 522, may comprise means for receiving the RF signal, e.g., in the configuration shown in FIG. 6 with the signal preconditioner 520 integrated with the antenna sub-system 510.

At stage 1320, the method 1300 includes selectively providing, at the radio-frequency signal preconditioning apparatus, any of a plurality of gains to the radio-frequency signal to produce an output signal, the plurality of gains spanning a first range. For example, the variable gain circuit 522 applies a net positive gain, a net negative gain, or a net zero gain, to each of one or more signals received from the antenna sub-system 510 (or multiple antenna sub-systems 510). The controller 521 may control the variable gain circuit 522 to provide the appropriate gain(s), e.g., by controlling the variable gain circuit 522 to route the received signal through one of the attenuators 911-913, or to bypass the attenuators 911-913, and/or to route the received signal through one of the amplifiers 921, 922 and/or through one of the amplifiers 923, 924 and/or to bypass the amplifiers 921, 922 and/or to bypass the amplifiers 923, 924. The controller 521 (e.g., the processor 992 possibly in combination with the memory 993) and the variable gain circuit 522 may comprise means for selectively providing any of the plurality of gains to the RF signal.

At stage 1330, the method 1300 includes providing, from the radio-frequency signal preconditioning apparatus, the output signal to a conversion circuit configured to convert the output signal from an analog signal at a radio frequency to a digital signal at a baseband frequency, the conversion circuit having a dynamic range spanning a second range that is smaller than the first range. For example, the signal preconditioner 520 provides the output signal, e.g., the RF signal(s) 1224, to the RFIC 530 for the RFIC 530 to convert the RF signal(s) 1224 to one or more digital baseband signals, with the gain range providable by the variable gain circuit 522 being larger than the dynamic range of the RFIC 530 (e.g., based on the dynamic range of each of one or more components of the RFIC 530, e.g., an ADC). A conductive mechanical output 524 configured to couple to a transmission line 516 connected to the RFIC 530 may comprise means for providing the output signal to the conversion circuit, e.g., for a standalone configuration of the signal preconditioner 520 shown in FIG. 5 or the configuration shown in FIG. 6 with the signal preconditioner 520 integrated with the antenna sub-system 510. A conductive line 720, e.g., a transmission line, or an output of a component of the variable gain circuit 522, may comprise means for providing the output signal, e.g., in the configuration shown in FIG. 7 with the signal preconditioner 520 integrated with the RFIC 530 and the baseband processing block 540.

Implementations of the method 1300 may include one or more of the following features. In an example implementation, selectively providing any of the plurality of gains comprises selectively providing any of the plurality of gains such that an energy of the output signal is within a dynamic range of the conversion circuit. For example, based on an indication that the RFIC 530 is undersaturated (or oversaturated) the controller 521 may cause the variable gain circuit 522 to increase (or decrease) the gain provided in order to provide the output signal within the dynamic range of the RFIC 530. The baseband processing unit 540 and the controller 522 may combine to cause the output signal provided by the signal preconditioner 520 to be within the dynamic range of the RFIC 530, even if multiple gain adjustments are used in order to move the output signal from being outside the dynamic range of the RFIC 530 to inside the dynamic range of the RFIC 530. For example, the baseband processing block 540 may provide one or more control signals 541 to the controller 521 for the controller 521 to adjust the gain of the variable gain circuit 522 as long as the measurement(s) by the baseband processing block 540 indicate that the RFIC 530 is being oversaturated or undersaturated. In another example implementation, selectively providing any of the plurality of gains comprises selectively providing any of the plurality of gains based on an indication of a gain provided by the antenna, or an indication of an attenuation provided by a connection of the antenna to the radio-frequency signal preconditioning apparatus, or an indication of the dynamic range of the conversion circuit, or a combination thereof. For example, the controller 521 may set the gain provided by the variable gain circuit 522 based on the control signal(s) 542 explicitly indicating the gain of the antenna 511 (which will likely be a positive gain), implicitly indicating the gain of the antenna 511 (e.g., providing an indication of the antenna type), explicitly indicating an attenuation of the transmission line 514, implicitly indicating the attenuation of the transmission line 514 (e.g., indicating the type and length of the transmission line 514), explicitly indicating the dynamic range of the RFIC 530, and/or implicitly indicating the dynamic range of the RFIC 530 (e.g., by indicating a model number or type of the RFIC 530). In another example implementation, selectively providing any of the plurality of gains comprises selectively providing any of the plurality of gains based on a jamming indication, or a spoofing indication, or a wide area network signal transmission that couples to the antenna, or a combination thereof. For example, the baseband processing block 540 may indicate, via the control signal(s) 541, that the signal(s) received by the antenna 511 is(are) being jammed, or is(are) being spoofed. The jamming indication may be due to any of a variety of signals, e.g. an intentional jamming signal or an unintentional jamming signal. Examples of unintentional jamming signals include a repeated SV signal transmitted by a terrestrial-based repeater, noise due to a transmission by a device including the signal receiving system 500 (e.g., noise from a windshield wiper circuit), a communication signal such as a cellular communication signal, etc. Jamming due to transmission by a device including the signal receiving system 500 may be of a known amount and may be proactively compensated for if timing of the transmission is known. For example, based on a planned communication transmission, a control signal may be sent to the controller 521 indicating an amount of gain compensation to provide to counteract the expected signal jamming. The jamming may be in a particular frequency band and the controller 522 may control the variable gain circuit 522 to compensate for the jamming signal, e.g., decrease positive gain and/or increase negative gain (attenuation), at least for the frequency/frequency band of the jamming signal.

Also or alternatively, implementations of the method 1300 may include on or more of the following features. In an example implementation, the radio-frequency signal is a first radio-frequency signal of a first frequency band, the plurality of gains is a first plurality of gains, and the radio-frequency signal preconditioning method further comprises selectively providing, independent of selectively providing any of the first plurality of gains to the first radio-frequency signal, any of a second plurality of gains to a second radio-frequency signal of a second frequency band that is different from the first frequency band. For example, the variable gain circuit 522 may apply different gains to different receive chains, e.g., the receive chains 1123, 1124, corresponding to different frequency bands. Different receive chains, e.g., the receive chains 1123, 1124, may comprise means for selectively providing gains to RF signals of different frequency bands. In another example implementation, selectively providing any of the plurality of gains comprises selectively providing any of the plurality of gains based on one or more metrics of gain of a baseband signal corresponding to the output signal. For example, the baseband processing block 540 may provide indications of one or more metrics of gain of one or more baseband signals corresponding to the output signal (e.g., one or more output signals). The metric(s) of gain may be metric(s) of energy (e.g., power or voltage) of the baseband signal(s) based on knowledge of energy of one or more corresponding signals upon receipt by the antenna 511. In another example implementation, selectively providing any of the plurality of gains comprises selecting a particular one of the plurality of gains and providing the particular one of the plurality of gains permanently. For example, during manufacture of the signal preconditioner 520, the control signal(s) 542 may be provided to the controller 521 to cause the controller 521 to cause the variable gain circuit 522 to set a gain to be provided by the variable gain circuit 522, and to disable further setting/changing of the gain to be provided by the variable gain circuit 522. As another example, upon initial use of the signal receiving system 500 upon deployment (after manufacture) the controller 522 may respond to the control signal(s) 541 to set a gain to be provided by the variable gain circuit 522, and to disable further setting/changing of the gain to be provided by the variable gain circuit 522.

Implementation Examples

Implementation examples are provided in the following numbered clauses.

Clause 1. A radio-frequency signal preconditioning apparatus comprising:

a variable gain circuit configured to receive a radio-frequency signal from an antenna and configured to selectively provide any of a plurality of gains to the radio-frequency signal to produce an output signal, the plurality of gains spanning a first range; and an output communicatively coupled to the variable gain circuit and configured to receive the output signal and to provide the output signal to a conversion circuit configured to convert the output signal from an analog signal at a radio frequency to a digital signal at a baseband frequency, the conversion circuit having a dynamic range spanning a second range that is smaller than the first range.

Clause 2. The radio-frequency signal preconditioning apparatus of clause 1, further comprising a controller communicatively coupled to the variable gain circuit and configured to control which of the plurality of gains the variable gain circuit provides such that an energy of the output signal is within the dynamic range of the conversion circuit.

Clause 3. The radio-frequency signal preconditioning apparatus of clause 1, further comprising a controller communicatively coupled to the variable gain circuit and configured to control which of the plurality of gains the variable gain circuit provides based on an indication of a gain provided by the antenna, or an indication of an attenuation provided by a connection of the antenna to the radio-frequency signal preconditioning apparatus, or an indication of the dynamic range of the conversion circuit, or a combination thereof.

Clause 4. The radio-frequency signal preconditioning apparatus of clause 1, further comprising a controller communicatively coupled to the variable gain circuit and configured to control which of the plurality of gains the variable gain circuit provides based on a jamming indication, or a spoofing indication, or a wide area network signal transmission that couples to the antenna, or a combination thereof.

Clause 5. The radio-frequency signal preconditioning apparatus of clause 1, wherein:

the radio-frequency signal is a first radio-frequency signal of a first frequency band;

the plurality of gains is a first plurality of gains;

the variable gain circuit comprises a first receive chain configured to receive the first radio-frequency signal and to provide the first plurality of gains to the first radio-frequency signal, and a second receive chain configured to receive a second radio-frequency signal in a second frequency band, different from the first frequency band, and to provide a second plurality of gains to the second radio-frequency signal; and the radio-frequency signal preconditioning apparatus comprises a controller communicatively coupled to the variable gain circuit and configured to control which of the first plurality of gains the variable gain circuit provides to the first radio-frequency signal and which of the second plurality of gains the variable gain circuit provides to the second radio-frequency signal.

Clause 6. The radio-frequency signal preconditioning apparatus of clause 1, wherein the radio-frequency signal preconditioning apparatus is part of a monolithic device comprising the conversion circuit and a baseband processor, and wherein the radio-frequency signal preconditioning apparatus comprises a controller communicatively coupled to the variable gain circuit and configured to control which of the plurality of gains the variable gain circuit provides based on feedback received from the baseband processor corresponding to one or more metrics of gain of a baseband signal processed by the baseband processor.

Clause 7. The radio-frequency signal preconditioning apparatus of clause 1, wherein the variable gain circuit is configured to be set to provide a particular one of the plurality of gains permanently.

Clause 8. The radio-frequency signal preconditioning apparatus of clause 1, wherein the radio-frequency signal preconditioning apparatus is part of a monolithic device comprising the antenna.

Clause 9. A radio-frequency signal preconditioning method comprising:

receiving, at a radio-frequency signal preconditioning apparatus from an antenna, a radio-frequency signal;

selectively providing, at the radio-frequency signal preconditioning apparatus, any of a plurality of gains to the radio-frequency signal to produce an output signal, the plurality of gains spanning a first range; and providing, from the radio-frequency signal preconditioning apparatus, the output signal to a conversion circuit configured to convert the output signal from an analog signal at a radio frequency to a digital signal at a baseband frequency, the conversion circuit having a dynamic range spanning a second range that is smaller than the first range.

Clause 10. The radio-frequency signal preconditioning method of clause 9, wherein selectively providing any of the plurality of gains comprises selectively providing any of the plurality of gains such that an energy of the output signal is within the dynamic range of the conversion circuit.

Clause 11. The radio-frequency signal preconditioning method of clause 9, wherein selectively providing any of the plurality of gains comprises selectively providing any of the plurality of gains based on an indication of a gain provided by the antenna, or an indication of an attenuation provided by a connection of the antenna to the radio-frequency signal preconditioning apparatus, or an indication of the dynamic range of the conversion circuit, or a combination thereof.

Clause 12. The radio-frequency signal preconditioning method of clause 9, wherein selectively providing any of the plurality of gains comprises selectively providing any of the plurality of gains based on a jamming indication, or a spoofing indication, or a wide area network signal transmission that couples to the antenna, or a combination thereof.

Clause 13. The radio-frequency signal preconditioning method of clause 9, wherein:

the radio-frequency signal is a first radio-frequency signal of a first frequency band;

the plurality of gains is a first plurality of gains; and the radio-frequency signal preconditioning method further comprises selectively providing, independent of selectively providing any of the first plurality of gains to the first radio-frequency signal, any of a second plurality of gains to a second radio-frequency signal of a second frequency band that is different from the first frequency band.

Clause 14. The radio-frequency signal preconditioning method of clause 9, wherein selectively providing any of the plurality of gains comprises selectively providing any of the plurality of gains based on one or more metrics of gain of a baseband signal corresponding to the output signal.

Clause 15. The radio-frequency signal preconditioning method of clause 9, wherein selectively providing any of the plurality of gains comprises selecting a particular one of the plurality of gains and providing the particular one of the plurality of gains permanently.

Clause 16. A radio-frequency signal preconditioning apparatus comprising:

means for receiving a radio-frequency signal from an antenna;

means for selectively providing any of a plurality of gains to the radio-frequency signal to produce an output signal, the plurality of gains spanning a first range; and means for providing the output signal to a conversion circuit configured to convert the output signal from an analog signal at a radio frequency to a digital signal at a baseband frequency, the conversion circuit having a dynamic range spanning a second range that is smaller than the first range.

Clause 17. The radio-frequency signal preconditioning apparatus of clause 16, wherein the means for selectively providing any of the plurality of gains comprise means for selectively providing any of the plurality of gains such that an energy of the output signal is within the dynamic range of the conversion circuit.

Clause 18. The radio-frequency signal preconditioning apparatus of clause 16, wherein the means for selectively providing any of the plurality of gains comprise means for selectively providing any of the plurality of gains based on an indication of a gain provided by the antenna, or an indication of an attenuation provided by a connection of the antenna to the radio-frequency signal preconditioning apparatus, or an indication of the dynamic range of the conversion circuit, or a combination thereof.

Clause 19. The radio-frequency signal preconditioning apparatus of clause 16, wherein the means for selectively providing any of the plurality of gains comprise means for selectively providing any of the plurality of gains based on a jamming indication, or a spoofing indication, or a wide area network signal transmission that couples to the antenna, or a combination thereof.

Clause 20. The radio-frequency signal preconditioning apparatus of clause 16, wherein:

the radio-frequency signal is a first radio-frequency signal of a first frequency band;

the plurality of gains is a first plurality of gains; and the radio-frequency signal preconditioning apparatus further comprises means for selectively providing, independent of selectively providing any of the first plurality of gains to the first radio-frequency signal, any of a second plurality of gains to a second radio-frequency signal of a second frequency band that is different from the first frequency band.

Clause 21. The radio-frequency signal preconditioning apparatus of clause 16, wherein the means for selectively providing any of the plurality of gains comprise means for selectively providing any of the plurality of gains based on one or more metrics of gain of a baseband signal corresponding to the output signal.

Clause 22. The radio-frequency signal preconditioning apparatus of clause 16, wherein the means for selectively providing any of the plurality of gains comprise means for selecting a particular one of the plurality of gains and providing the particular one of the plurality of gains permanently.

Clause 23. A non-transitory, processor-readable storage medium comprising processor-readable instructions to cause a processor of a radio-frequency signal preconditioning apparatus to:

receive a radio-frequency signal from an antenna;

selectively cause the radio-frequency signal preconditioning apparatus to provide any of a plurality of gains to the radio-frequency signal to produce an output signal, the plurality of gains spanning a first range and to provide the output signal to a conversion circuit configured to convert the output signal from an analog signal at a radio frequency to a digital signal at a baseband frequency, the conversion circuit having a dynamic range spanning a second range that is smaller than the first range.

Clause 24. The storage medium of clause 23, the processor-readable instructions to cause the processor to selectively cause the radio-frequency signal preconditioning apparatus to provide any of the plurality of gains comprise processor-readable instructions to cause the processor to selectively provide any of the plurality of gains such that an energy of the output signal is within the dynamic range of the conversion circuit.

Clause 25. The storage medium of clause 23, wherein the processor-readable instructions to cause the processor to selectively cause the radio-frequency signal preconditioning apparatus to provide any of the plurality of gains comprise processor-readable instructions to cause the processor to selectively cause the radio-frequency signal preconditioning apparatus to provide any of the plurality of gains based on an indication of a gain provided by the antenna, or an indication of an attenuation provided by a connection of the antenna to the radio-frequency signal preconditioning apparatus, or an indication of the dynamic range of the conversion circuit, or a combination thereof.

Clause 26. The storage medium of clause 23, wherein the processor-readable instructions to cause the processor to selectively cause the radio-frequency signal preconditioning apparatus to provide any of the plurality of gains comprise processor-readable instructions to cause the processor to selectively cause the radio-frequency signal preconditioning apparatus to provide any of the plurality of gains based on a jamming indication, or a spoofing indication, or a wide area network signal transmission that couples to the antenna, or a combination thereof.

Clause 27. The storage medium of clause 23, wherein:

the radio-frequency signal is a first radio-frequency signal of a first frequency band;

the plurality of gains is a first plurality of gains; and the storage medium further comprises processor-readable instructions to cause the processor to cause the radio-frequency signal preconditioning apparatus to selectively provide, independent of selectively providing any of the first plurality of gains to the first radio-frequency signal, any of a second plurality of gains to a second radio-frequency signal of a second frequency band that is different from the first frequency band.

Clause 28. The storage medium of clause 23, wherein the processor-readable instructions to cause the processor to selectively cause the radio-frequency signal preconditioning apparatus to provide any of the plurality of gains comprise processor-readable instructions to cause the processor to selectively cause the radio-frequency signal preconditioning apparatus to provide any of the plurality of gains based on one or more metrics of gain of a baseband signal corresponding to the output signal.

Clause 29. The storage medium of clause 23, wherein the processor-readable instructions to cause the processor to selectively cause the radio-frequency signal preconditioning apparatus to provide any of the plurality of gains comprise processor-readable instructions to cause the processor to select a particular one of the plurality of gains and cause the radio-frequency signal preconditioning apparatus to provide the particular one of the plurality of gains permanently.

Other Considerations

Other examples and implementations are within the scope of the disclosure and appended claims. For example, due to the nature of software and computers, functions described above can be implemented using software executed by a processor, hardware, firmware, hardwiring, or a combination of any of these. Features implementing functions may also be physically located at various positions, including being distributed such that portions of functions are implemented at different physical locations.

As used herein, the singular forms "a," "an," and "the" include the plural forms as well, unless the context clearly indicates otherwise. The terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

As used herein, the term RS (reference signal) may refer to one or more reference signals and may apply, as appropriate, to any form of the term RS, e.g., PRS, SRS, CSI-RS, etc.

As used herein, unless otherwise stated, a statement that a function or operation is "based on" an item or condition means that the function or operation is based on the stated item or condition and may be based on one or more items and/or conditions in addition to the stated item or condition.

Also, as used herein, "or" as used in a list of items (possibly prefaced by "at least one of" or prefaced by "one or more of") indicates a disjunctive list such that, for example, a list of "at least one of A, B, or C," or a list of "one or more of A, B, or C" or a list of "A or B or C" means A, or B, or C, or AB (A and B), or AC (A and C), or BC (B and C), or ABC (i.e., A and B and C), or combinations with more than one feature (e.g., AA, AAB, ABBC, etc.). Thus, a recitation that an item, e.g., a processor, is configured to perform a function regarding at least one of A or B, or a recitation that an item is configured to perform a function A or a function B, means that the item may be configured to perform the function regarding A, or may be configured to perform the function regarding B, or may be configured to perform the function regarding A and B. For example, a phrase of "a processor configured to measure at least one of A or B" or "a processor configured to measure A or measure B" means that the processor may be configured to measure A (and may or may not be configured to measure B), or may be configured to measure B (and may or may not be configured to measure A), or may be configured to measure A and measure B (and may be configured to select which, or both, of A and B to measure). Similarly, a recitation of a means for measuring at least one of A or B includes means for measuring A (which may or may not be able to measure B), or means for measuring B (and may or may not be configured to measure A), or means for measuring A and B (which may be able to select which, or both, of A and B to measure). As another example, a recitation that an item, e.g., a processor, is configured to at least one of perform function X or perform function Y means that the item may be configured to perform the function X, or may be configured to perform the function Y, or may be configured to perform the function X and to perform the function Y. For example, a phrase of "a processor configured to at least one of measure X or measure Y" means that the processor may be configured to measure X (and may or may not be configured to measure Y), or may be configured to measure Y (and may or may not be configured to measure X), or may be configured to measure X and to measure Y (and may be configured to select which, or both, of X and Y to measure).

Substantial variations may be made in accordance with specific requirements. For example, customized hardware might also be used, and/or particular elements might be implemented in hardware, software (including portable software, such as applets, etc.) executed by a processor, or both. Further, connection to other computing devices such as network input/output devices may be employed. Components, functional or otherwise, shown in the figures and/or discussed herein as being connected or communicating with each other are communicatively coupled unless otherwise noted. That is, they may be directly or indirectly connected to enable communication between them.

The systems and devices discussed above are examples. Various configurations may omit, substitute, or add various procedures or components as appropriate. For instance, features described with respect to certain configurations may be combined in various other configurations. Different aspects and elements of the configurations may be combined in a similar manner. Also, technology evolves and, thus, many of the elements are examples and do not limit the scope of the disclosure or claims.

A wireless communication system is one in which communications are conveyed wirelessly, i.e., by electromagnetic and/or acoustic waves propagating through atmospheric space rather than through a wire or other physical connection. A wireless communication network may not have all communications transmitted wirelessly, but is configured to have at least some communications transmitted wirelessly. Further, the term "wireless communication device," or similar term, does not require that the functionality of the device is exclusively, or evenly primarily, for communication, or that the device be a mobile device, but indicates that the device includes wireless communication capability (one-way or two-way), e.g., includes at least one radio (each radio being part of a transmitter, receiver, or transceiver) for wireless communication.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements.

The terms "processor-readable medium," "machine-readable medium," and "computer-readable medium," as used herein, refer to any medium that participates in providing data that causes a machine to operate in a specific fashion. Using a computing platform, various processor-readable media might be involved in providing instructions/code to processor(s) for execution and/or might be used to store and/or carry such instructions/code (e.g., as signals). In many implementations, a processor-readable medium is a physical and/or tangible storage medium. Such a medium may take many forms, including but not limited to, non-volatile media and volatile media. Non-volatile media include, for example, optical and/or magnetic disks. Volatile media include, without limitation, dynamic memory.

Having described several example configurations, various modifications, alternative constructions, and equivalents may be used. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

A statement that a value exceeds (or is more than or above) a first threshold value is equivalent to a statement that the value meets or exceeds a second threshold value that is slightly greater than the first threshold value, e.g., the second threshold value being one value higher than the first threshold value in the resolution of a computing system. A statement that a value is less than (or is within or below) a first threshold value is equivalent to a statement that the value is less than or equal to a second threshold value that is slightly lower than the first threshold value, e.g., the second threshold value being one value lower than the first threshold value in the resolution of a computing system.

The invention claimed is:

1. A radio-frequency signal preconditioning apparatus comprising:
   a variable gain circuit configured to receive a radio-frequency signal from an antenna and configured to selectively provide any of a plurality of gains to the radio-frequency signal to produce an output signal, the plurality of gains spanning a first range and including at least one positive gain and at least one negative gain;
   an output communicatively coupled to the variable gain circuit and configured to receive the output signal and to provide the output signal to a conversion circuit configured to convert the output signal from an analog signal at a radio frequency to a digital signal at a baseband frequency, the conversion circuit having a dynamic range spanning a second range that is smaller than the first range, and wherein the variable gain circuit is configured to provide a coarse gain adjustment to the output signal before being provided to the conversion circuit and the conversion circuit is configured to provide a fine gain adjustment to the output signal; and
   a controller communicatively coupled to the variable gain circuit and configured to control which of the plurality of gains the variable gain circuit provides such that an energy of the output signal is within the dynamic range of the conversion circuit.

2. The radio-frequency signal preconditioning apparatus of claim 1, further comprising a controller communicatively coupled to the variable gain circuit and configured to control which of the plurality of gains the variable gain circuit provides based on an indication of a gain provided by the antenna, or an indication of an attenuation provided by a connection of the antenna to the radio-frequency signal preconditioning apparatus, or an indication of the dynamic range of the conversion circuit, or a combination thereof.

3. The radio-frequency signal preconditioning apparatus of claim 1, further comprising a controller communicatively coupled to the variable gain circuit and configured to control which of the plurality of gains the variable gain circuit provides based on a jamming indication, or a spoofing indication, or a wide area network signal transmission that couples to the antenna, or a combination thereof.

4. The radio-frequency signal preconditioning apparatus of claim 1, wherein:
   the radio-frequency signal is a first radio-frequency signal of a first frequency band;
   the plurality of gains is a first plurality of gains;
   the variable gain circuit comprises a first receive chain configured to receive the first radio-frequency signal and to provide the first plurality of gains to the first radio-frequency signal, and a second receive chain configured to receive a second radio-frequency signal in a second frequency band, different from the first frequency band, and to provide a second plurality of gains to the second radio-frequency signal; and
   the radio-frequency signal preconditioning apparatus comprises a controller communicatively coupled to the variable gain circuit and configured to control which of the first plurality of gains the variable gain circuit provides to the first radio-frequency signal and which of the second plurality of gains the variable gain circuit provides to the second radio-frequency signal.

5. The radio-frequency signal preconditioning apparatus of claim 1, wherein the radio-frequency signal preconditioning apparatus is part of a monolithic device comprising the conversion circuit and a baseband processor, and wherein the radio-frequency signal preconditioning apparatus comprises a controller communicatively coupled to the variable gain circuit and configured to control which of the plurality of gains the variable gain circuit provides based on feedback received from the baseband processor corresponding to one or more metrics of gain of a baseband signal processed by the baseband processor.

6. The radio-frequency signal preconditioning apparatus of claim 1, wherein the variable gain circuit is configured to be set to provide a particular one of the plurality of gains permanently.

7. The radio-frequency signal preconditioning apparatus of claim 1, wherein the radio-frequency signal preconditioning apparatus is part of a monolithic device comprising the antenna.

8. A radio-frequency signal preconditioning method comprising:
   receiving, at a radio-frequency signal preconditioning apparatus from an antenna, a radio-frequency signal;
   selectively providing, at the radio-frequency signal preconditioning apparatus, any of a plurality of gains to the radio-frequency signal to produce an output signal, the plurality of gains spanning a first range and including at least one positive gain and at least one negative gain; and
   providing, from the radio-frequency signal preconditioning apparatus, the output signal to a conversion circuit configured to convert the output signal from an analog signal at a radio frequency to a digital signal at a baseband frequency, the conversion circuit having a dynamic range spanning a second range that is smaller than the first range, and wherein the radio-frequency signal preconditioning apparatus is configured to provide a coarse gain adjustment to the output signal before being provided to the conversion circuit and the conversion circuit is configured to provide a fine gain adjustment to the output signal;
   wherein selectively providing any of the plurality of gains comprises selectively providing any of the plurality of gains such that an energy of the output signal is within the dynamic range of the conversion circuit.

9. The radio-frequency signal preconditioning method of claim 8, wherein selectively providing any of the plurality of gains comprises selectively providing any of the plurality of gains based on an indication of a gain provided by the antenna, or an indication of an attenuation provided by a connection of the antenna to the radio-frequency signal preconditioning apparatus, or an indication of the dynamic range of the conversion circuit, or a combination thereof.

10. The radio-frequency signal preconditioning method of claim 8, wherein selectively providing any of the plurality of gains comprises selectively providing any of the plurality of gains based on a jamming indication, or a spoofing indication, or a wide area network signal transmission that couples to the antenna, or a combination thereof.

11. The radio-frequency signal preconditioning method of claim 8, wherein:
the radio-frequency signal is a first radio-frequency signal of a first frequency band;
the plurality of gains is a first plurality of gains; and
the radio-frequency signal preconditioning method further comprises selectively providing, independent of selectively providing any of the first plurality of gains to the first radio-frequency signal, any of a second plurality of gains to a second radio-frequency signal of a second frequency band that is different from the first frequency band.

12. The radio-frequency signal preconditioning method of claim 8, wherein selectively providing any of the plurality of gains comprises selectively providing any of the plurality of gains based on one or more metrics of gain of a baseband signal corresponding to the output signal.

13. The radio-frequency signal preconditioning method of claim 8, wherein selectively providing any of the plurality of gains comprises selecting a particular one of the plurality of gains and providing the particular one of the plurality of gains permanently.

14. A radio-frequency signal preconditioning apparatus comprising:
means for receiving a radio-frequency signal from an antenna;
means for selectively providing any of a plurality of gains to the radio-frequency signal to produce an output signal, the plurality of gains spanning a first range and including at least one positive gain and at least one negative gain; and
means for providing the output signal to a conversion circuit configured to convert the output signal from an analog signal at a radio frequency to a digital signal at a baseband frequency, the conversion circuit having a dynamic range spanning a second range that is smaller than the first range, and wherein the means for selectively providing any of the plurality of gains to the radio-frequency signal is configured to provide a coarse gain adjustment to the output signal before being provided to the conversion circuit and the conversion circuit is configured to provide a fine gain adjustment to the output signal;
wherein the means for selectively providing any of the plurality of gains comprise means for selectively providing any of the plurality of gains such that an energy of the output signal is within the dynamic range of the conversion circuit.

15. The radio-frequency signal preconditioning apparatus of claim 14, wherein the means for selectively providing any of the plurality of gains comprise means for selectively providing any of the plurality of gains based on an indication of a gain provided by the antenna, or an indication of an attenuation provided by a connection of the antenna to the radio-frequency signal preconditioning apparatus, or an indication of the dynamic range of the conversion circuit, or a combination thereof.

16. The radio-frequency signal preconditioning apparatus of claim 14, wherein the means for selectively providing any of the plurality of gains comprise means for selectively providing any of the plurality of gains based on a jamming indication, or a spoofing indication, or a wide area network signal transmission that couples to the antenna, or a combination thereof.

17. The radio-frequency signal preconditioning apparatus of claim 14, wherein:
the radio-frequency signal is a first radio-frequency signal of a first frequency band;
the plurality of gains is a first plurality of gains; and
the radio-frequency signal preconditioning apparatus further comprises means for selectively providing, independent of selectively providing any of the first plurality of gains to the first radio-frequency signal, any of a second plurality of gains to a second radio-frequency signal of a second frequency band that is different from the first frequency band.

18. The radio-frequency signal preconditioning apparatus of claim 14, wherein the means for selectively providing any of the plurality of gains comprise means for selectively providing any of the plurality of gains based on one or more metrics of gain of a baseband signal corresponding to the output signal.

19. The radio-frequency signal preconditioning apparatus of claim 14, wherein the means for selectively providing any of the plurality of gains comprise means for selecting a particular one of the plurality of gains and providing the particular one of the plurality of gains permanently.

20. A non-transitory, processor-readable storage medium comprising processor-readable instructions to cause a processor of a radio-frequency signal preconditioning apparatus to:
receive a radio-frequency signal from an antenna; and
selectively cause the radio-frequency signal preconditioning apparatus to provide any of a plurality of gains to the radio-frequency signal to produce an output signal, the plurality of gains spanning a first range including at least one positive gain and at least one negative gain, and to provide the output signal to a conversion circuit configured to convert the output signal from an analog signal at a radio frequency to a digital signal at a baseband frequency, the conversion circuit having a dynamic range spanning a second range that is smaller than the first range, and wherein the radio-frequency signal preconditioning apparatus is configured to provide a coarse gain adjustment to the output signal before being provided to the conversion circuit and the conversion circuit is configured to provide a fine gain adjustment to the output signal;
wherein the processor-readable instructions to cause the processor to selectively cause the radio-frequency signal preconditioning apparatus to provide any of the plurality of gains comprise processor-readable instructions to cause the processor to selectively provide any of the plurality of gains such that an energy of the output signal is within the dynamic range of the conversion circuit.

21. The storage medium of claim 20, wherein the processor-readable instructions to cause the processor to selectively cause the radio-frequency signal preconditioning apparatus to provide any of the plurality of gains comprise processor-readable instructions to cause the processor to selectively cause the radio-frequency signal preconditioning apparatus to provide any of the plurality of gains based on an indication of a gain provided by the antenna, or an indication of an attenuation provided by a connection of the antenna to the radio-frequency signal preconditioning apparatus, or an indication of the dynamic range of the conversion circuit, or a combination thereof.

22. The storage medium of claim 20, wherein the processor-readable instructions to cause the processor to selectively cause the radio-frequency signal preconditioning apparatus to provide any of the plurality of gains comprise processor-readable instructions to cause the processor to selectively cause the radio-frequency signal preconditioning apparatus to provide any of the plurality of gains based on a jamming indication, or a spoofing indication, or a wide area network signal transmission that couples to the antenna, or a combination thereof.

23. The storage medium of claim 20, wherein:
the radio-frequency signal is a first radio-frequency signal of a first frequency band;
the plurality of gains is a first plurality of gains; and
the storage medium further comprises processor-readable instructions to cause the processor to cause the radio-frequency signal preconditioning apparatus to selectively provide, independent of selectively providing any of the first plurality of gains to the first radio-frequency signal, any of a second plurality of gains to a second radio-frequency signal of a second frequency band that is different from the first frequency band.

24. The storage medium of claim 20, wherein the processor-readable instructions to cause the processor to selectively cause the radio-frequency signal preconditioning apparatus to provide any of the plurality of gains comprise processor-readable instructions to cause the processor to selectively cause the radio-frequency signal preconditioning apparatus to provide any of the plurality of gains based on one or more metrics of gain of a baseband signal corresponding to the output signal.

25. The storage medium of claim 20, wherein the processor-readable instructions to cause the processor to selectively cause the radio-frequency signal preconditioning apparatus to provide any of the plurality of gains comprise processor-readable instructions to cause the processor to select a particular one of the plurality of gains and cause the radio-frequency signal preconditioning apparatus to provide the particular one of the plurality of gains permanently.

26. A radio-frequency signal preconditioning apparatus comprising:
a variable gain circuit configured to receive a radio-frequency signal from an antenna and configured to selectively provide any of a plurality of gains to the radio-frequency signal to produce an output signal, the plurality of gains spanning a first range and including at least one positive gain and at least one negative gain;
an output communicatively coupled to the variable gain circuit and configured to receive the output signal and to provide the output signal to a conversion circuit configured to convert the output signal from an analog signal at a radio frequency to a digital signal at a baseband frequency, the conversion circuit having a dynamic range spanning a second range that is smaller than the first range, and wherein the variable gain circuit is configured to provide a coarse gain adjustment to the output signal before being provided to the conversion circuit, and the conversion circuit is configured to provide a fine gain adjustment to the output signal; and
a controller communicatively coupled to the variable gain circuit and configured to control which of the plurality of gains the variable gain circuit provides, based on an indication of an attenuation provided by a connection of the antenna to the radio-frequency signal preconditioning apparatus, such that an energy of the output signal is within the dynamic range of the conversion circuit.

\* \* \* \* \*